(12) United States Patent
Heo et al.

(10) Patent No.: US 12,388,052 B2
(45) Date of Patent: Aug. 12, 2025

(54) DISPLAY DEVICE

(71) Applicant: Samsung Display Co., Ltd., Yongin-si (KR)

(72) Inventors: Eui Kang Heo, Seoul (KR); Young Seok Baek, Hwaseong-si (KR); Chong Sup Chang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 53 days.

(21) Appl. No.: 17/232,019

(22) Filed: Apr. 15, 2021

(65) Prior Publication Data
US 2021/0359049 A1    Nov. 18, 2021

(30) Foreign Application Priority Data
May 13, 2020 (KR) .......................... 10-2020-0056951

(51) Int. Cl.
| | |
|---|---|
| *H01L 25/075* | (2006.01) |
| *H10K 50/844* | (2023.01) |
| *H10K 59/121* | (2023.01) |
| *H10K 59/122* | (2023.01) |
| *H10K 59/80* | (2023.01) |

(52) U.S. Cl.
CPC ....... *H01L 25/0753* (2013.01); *H10K 50/844* (2023.02); *H10K 59/1213* (2023.02); *H10K 59/122* (2023.02); *H10K 59/873* (2023.02)

(58) Field of Classification Search
CPC .......... H10K 27/3246; H10K 27/3262; H10K 51/5253; H10K 25/0753; H10K 33/62; H10K 59/122; H10K 59/1213; H10K 59/873; H10K 50/844
See application file for complete search history.

(56) References Cited

U.S. PATENT DOCUMENTS

| | | | |
|---|---|---|---|
| 10,461,123 B2 | 10/2019 | Kim et al. | |
| 10,943,947 B2 | 3/2021 | Im et al. | |
| 11,152,424 B2 | 10/2021 | Li et al. | |
| 11,574,954 B2 | 2/2023 | Im et al. | |
| 11,581,363 B2 | 2/2023 | Kim et al. | |
| 12,119,372 B2 | 10/2024 | Kim et al. | |
| 2018/0175106 A1* | 6/2018 | Kim | H10H 20/84 |
| 2019/0326348 A1* | 10/2019 | Im | G09G 3/32 |
| 2022/0037397 A1 | 2/2022 | Li et al. | |

(Continued)

FOREIGN PATENT DOCUMENTS

| | | |
|---|---|---|
| EP | 3 316 301 A1 | 5/2018 |
| EP | 3 496 143 A1 | 6/2019 |
| EP | 3 826 066 A1 | 5/2021 |

(Continued)

*Primary Examiner* — Vongsavanh Sengdara
(74) *Attorney, Agent, or Firm* — Womble Bond Dickinson (US) LLP

(57) ABSTRACT

A display device includes a thin film transistor layer including at least one transistor on a substrate; a first electrode on the thin film transistor layer and connected to the at least one transistor; a second electrode spaced from the first electrode on the thin film transistor layer; a plurality of light emitting elements connected to the first electrode and the second electrode; and an electrode pattern on a same layer as the first electrode and the second electrode and overlapping the plurality of light emitting elements in a thickness direction.

20 Claims, 14 Drawing Sheets

(56) References Cited

U.S. PATENT DOCUMENTS

2025/0040330 A1   1/2025   Kim et al.

FOREIGN PATENT DOCUMENTS

| JP | 2014-075550 A | 4/2014 |
| KR | 10-2018-0007025 A | 1/2018 |
| KR | 20180072909 A | 7/2018 |
| KR | 20190121894 A | 10/2019 |
| KR | 10-2020-0008075 A | 1/2020 |
| KR | 20200014955 A | 2/2020 |
| TW | 202006940 A | 2/2020 |

\* cited by examiner

DISPLAY DEVICE

CROSS-REFERENCE TO RELATED APPLICATION

This application claims priority to and the benefit of Korean Patent Application No. 10-2020-0056951 filed on May 13, 2020, in the Korean Intellectual Property Office, and all the benefits accruing therefrom under 35 U.S.C. 119, the content of which in its entirety is herein incorporated by reference.

BACKGROUND

1. Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device, and/or an organic light emitting display device. Among the flat panel display devices, in the light emitting display device, because each of pixels of a display panel includes a light emitting element capable of emitting light by itself, an image can be displayed without a backlight unit providing light to the display panel.

Each of the plurality of pixels of the display panel may include a plurality of light emitting elements. The light emitting elements may emit light upward from the light emitting elements or toward the front side of the display device. In this case, light emitted downward from the light emitting elements is blocked or absorbed by peripheral components, resulting in a reduction of light emission efficiency of the display device.

SUMMARY

Aspects of the present disclosure provide a display device capable of improving luminance of the display device by enhancing light emission efficiency of a plurality of light emitting elements.

However, the present disclosure is not limited to the aspects set forth herein. The above and other aspects of the present disclosure will become more apparent to one of ordinary skill in the art to which the present disclosure pertains by referencing the detailed description of the present disclosure given below.

According to one or more example embodiments of the present disclosure, a display device includes: a thin film transistor layer having at least one transistor on a substrate, a first electrode on the thin film transistor layer and connected to the at least one transistor, a second electrode spaced from the first electrode on the thin film transistor layer, a plurality of light emitting elements connected to the first electrode and the second electrode, and an electrode pattern at a same layer as the first electrode and the second electrode and overlapping the plurality of light emitting elements in a thickness direction.

The electrode pattern may be spaced and insulated from the first electrode and the second electrode.

The display device may further include a plurality of banks on the thin film transistor layer and having inclined surfaces facing the plurality of light emitting elements. Each of the first electrode and the second electrode may be on the inclined surfaces of the plurality of banks, and the electrode pattern may be located between the inclined surfaces of the plurality of banks.

The display device may further include a first passivation layer covering the electrode pattern, at least a portion of the first electrode, and at least a portion of the second electrode. The plurality of light emitting elements may be located on the first passivation layer to be insulated from the electrode pattern.

The display device may further include: a first contact electrode connected to the first electrode through a first contact hole provided in the first passivation layer, and a second contact electrode connected to the second electrode through a second contact hole provided in the first passivation layer. Each of the plurality of light emitting elements may include first and second semiconductor portions doped with different materials. The first contact electrode may be connected to the first semiconductor portion, and the second contact electrode may be connected to the second semiconductor portion.

The display device may further include: a second passivation layer covering a central portion of each of the light emitting elements and fixing the plurality of light emitting elements on the first passivation layer, a third passivation layer covering a portion of the first passivation layer, the first contact electrode, and the second passivation layer, and a fourth passivation layer covering another portion of the first passivation layer, the second contact electrode, and the third passivation layer.

The display device may further include: a second passivation layer covering a central portion of each of the light emitting elements and fixing the plurality of light emitting elements on the first passivation layer, and a third passivation layer covering the first passivation layer, the first and second contact electrodes, and the second passivation layer.

Each of the first electrode, the second electrode, and the electrode pattern may correspond to a reflective electrode containing at least one of aluminum (Al), magnesium (Mg), gold (Au), silver (Ag), rhodium (Rh), copper (Cu), titanium (Ti), chromium (Cr), nickel (Ni), or palladium (Pd).

The electrode pattern may be electrically floated, or grounded to a specific voltage.

The first electrode and the second electrode may extend in a first direction and may be spaced from each other in a second direction crossing the first direction. The electrode pattern may extend in the first direction between the first electrode and the second electrode.

The electrode pattern may include: a first electrode pattern that is parallel and adjacent to the first electrode, and a second electrode pattern that is parallel and adjacent to the second electrode.

The electrode pattern may include a plurality of electrode patterns. The plurality of electrode patterns may be spaced from each other along an extension direction of the first electrode or the second electrode.

The electrode pattern may be located between the first electrode and the second electrode and has a closed loop shape.

The display device may further include a plurality of pixels located on the substrate, each of the pixels including at least one first electrode, at least one second electrode, at least one electrode pattern, and light emitting elements corresponding to the at least one first electrode and the at least one second electrode from among the plurality of light emitting elements, wherein electrode patterns of the plurality of pixels have a same shape.

The display device may further include a plurality of pixels, each of the pixels having the plurality of light emitting elements corresponding to the first and second electrodes, and the electrode pattern located between the first and second electrodes. The electrode patterns of the plurality of pixels may have different shapes.

According to one or more embodiments of the present disclosure, a display device includes: a thin film transistor layer having at least one transistor on a substrate, a plurality of banks patterned on the thin film transistor layer and having inclined surfaces, a first electrode on a portion of the plurality of banks and connected to the at least one transistor, a second electrode on another portion of the plurality of banks and spaced from the first electrode, an electrode pattern at a same layer as the first electrode and the second electrode between the inclined surfaces of the plurality of banks, a first insulating film covering the first electrode, the second electrode, and the electrode pattern, and a plurality of light emitting elements located on the first insulating film and overlapping the electrode pattern in a thickness direction.

The first electrode and the second electrode may extend in a first direction and may be spaced from each other in a second direction crossing the first direction. The electrode pattern may extend in the first direction between the first electrode and the second electrode.

The electrode pattern may include: a first electrode pattern that is parallel and adjacent to the first electrode, and a second electrode pattern that is parallel and adjacent to the second electrode.

The electrode pattern may include a plurality of electrode patterns. The plurality of electrode patterns may be spaced from each other along an extension direction of the first electrode or the second electrode.

The electrode pattern may be located between the first electrode and the second electrode and has a closed loop shape.

According to the display device in accordance with example embodiments, because the display device includes an electrode pattern between a first electrode and a second electrode at a same layer as the first electrode and the second electrode, the loss of light emitted downward from the light emitting elements can be decreased. Consequently, because the display device includes the electrode pattern that overlaps the light emitting elements in a thickness direction and contains a reflective material, it is possible to enhance the light emission efficiency of the light emitting elements, thereby improving the luminance of the display device.

The example embodiments of the present disclosure are not limited to the aforementioned embodiments, and various other embodiments are included in the present disclosure.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
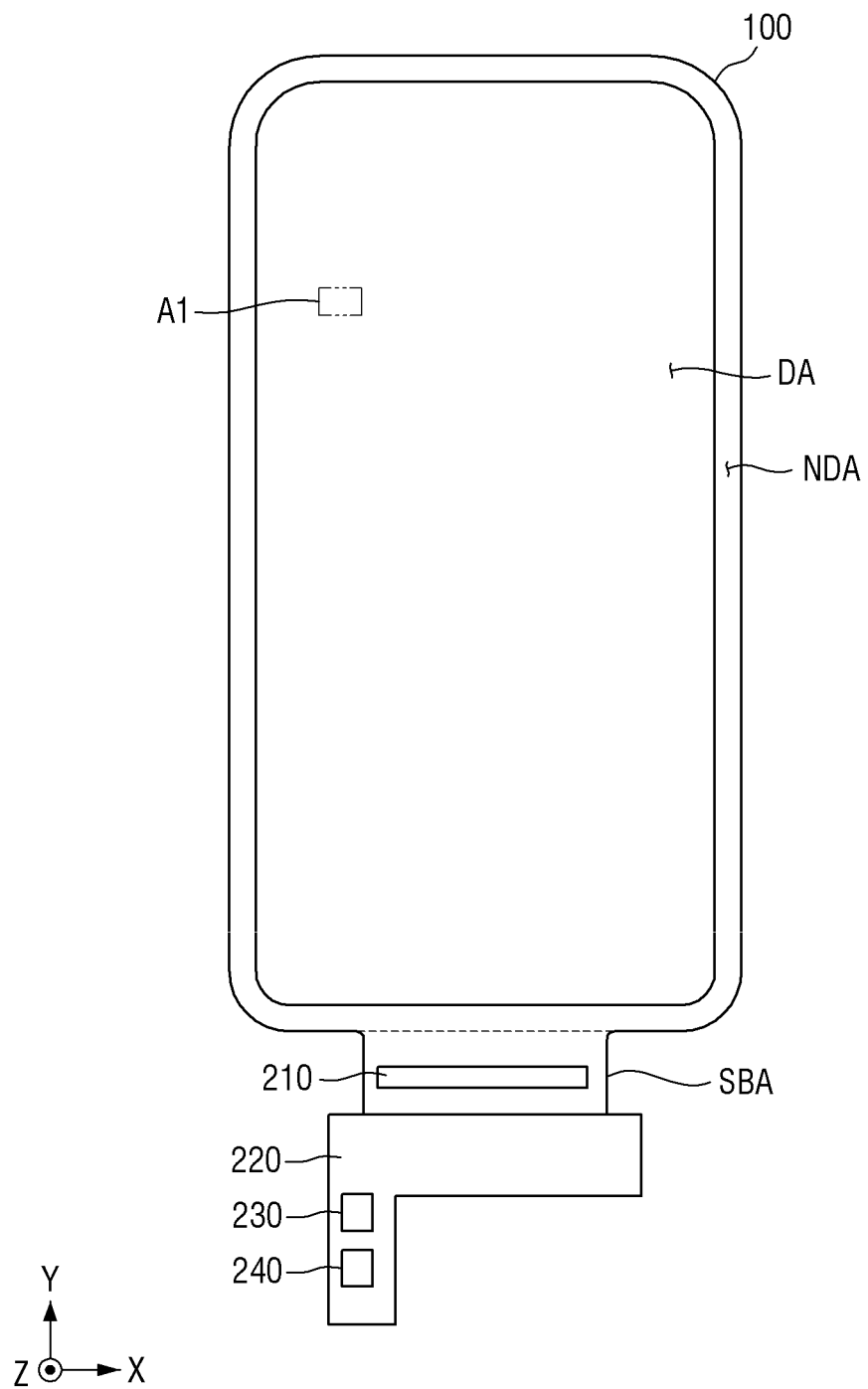
FIG. 1 is a plan view illustrating a display device according to one or more example embodiments of the present disclosure.

In the following description, for the purposes of explanation, numerous specific details are set forth in order to provide a thorough understanding of various example embodiments or implementations of the invention. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view illustrating a display device according to one or more example embodiments of the present disclosure.

Referring to FIG. 1, the display device may include a display panel 100, a display driver 210, a circuit board 220, a power supply unit 230, and a touch driver 240.

The terms "above," "top" and "upper surface" as used herein refer to an upward direction (i.e., a Z-axis direction) with respect to the display device. The terms "below," "bottom" and "lower surface" as used herein refer to a downward direction (i.e., a direction opposite to the Z-axis direction) with respect to the display device. Meanwhile, the terms "left," "right," "up," and "down" are respectively indicate corresponding directions on the surface of the display device. For example, the term "left" indicates a negative direction on the X-axis, the term "right" indicates a positive direction on the X-axis, the term "up" indicates a positive direction on the Y-axis, and the term "down" indicates a negative direction on the Y-axis.

The display device is a device for displaying a moving image or a still image. The display device may be used as a display screen of various products such as televisions, laptop computers, monitors, billboards, and the Internet of Things (IOT) as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra-mobile PCs (UMPCs).

The display panel 100 of the display device may have a rectangular shape in a plan view. For example, as shown in FIG. 1, in a plan view, the display device may have a rectangular shape having short sides in (i.e., extending in) a first direction (X-axis direction) and long sides in (i.e., extending in) a second direction (Y-axis direction). The corner where the short side in the first direction (X-axis direction) and the long side in the second direction (Y-axis direction) meet may be rounded to have a curvature (e.g., a set or predetermined curvature) or may be right-angled. The planar shape of the display device is not limited to a rectangular shape, and may be formed in other polygonal shapes, a circular shape, or elliptical shape.

The display panel 100 may be a light emitting display panel including a light emitting element. For example, the display panel 100 may be an organic light emitting display panel using an organic light emitting diode (OLED) including an organic light emitting layer, a micro light emitting diode display panel using a micro LED, a quantum dot light emitting display panel using a quantum dot light emitting diode including a quantum dot light emitting layer, or an inorganic light emitting display panel using an inorganic light emitting element including an inorganic semiconductor.

The display panel 100 may include a display area DA and a non-display area NDA.

The display area DA may include a plurality of pixels displaying an image, and the non-display area NDA which is a peripheral area of the display panel 100 and may not display an image. The non-display area NDA may be around (e.g., surround) the display area DA along the edge or periphery of the display area DA, but is not limited thereto. The display area DA may occupy most of the area of the display panel 100.

For example, the display panel 100 may include a touch electrode layer for sensing an object such as a human finger, a pen or the like. The touch electrode layer may include a plurality of touch electrodes, and may be disposed on a display layer on which the plurality of pixels are disposed.

The non-display area NDA may be defined as the remaining area of the display panel 100 except for the display area DA. For example, the non-display area NDA may include a gate driver for applying gate signals to gate lines, fan-out lines for connecting data lines to the display driver, and pads connected to the circuit board 220. For example, the non-display area NDA may be formed opaquely. The non-display area NDA may be formed as a decorative layer having a pattern that can be displayed to a user.

The display panel 100 may further include a sub-region SBA protruding from one side of the non-display area NDA.

The sub-region SBA may protrude from one side of the non-display area NDA in a direction opposite to the second direction (Y-axis direction). For example, the length of the sub-region SBA in the first direction (X-axis direction) may be smaller than the length of the display area DA in the first direction (X-axis direction), and the length of the sub-region SBA in the second direction (Y-axis direction) may be smaller than the length of the display area DA in the second direction (Y-axis direction), but the present disclosure is not limited thereto. The sub-region SBA may be foldable to be disposed under the display panel 100. In such a case, the sub-region SBA may overlap the display area DA in the third direction (Z-axis direction).

The display panel 100 may include the display driver 210, the circuit board 220, the power supply unit 230, and the touch driver 240.

The display driver 210 may be disposed in the sub-region SBA of the display panel 100. The display driver 210 may output signals and voltages for driving the display panel 300. For example, the display driver 210 may supply a data voltage to the data line. The display driver 210 may supply a driving voltage or a source voltage to a driving voltage line, and may supply a gate control signal to the gate driver.

The circuit board 220 may be attached onto a pad portion of the display panel 100 using a low resistance and high reliability material such as an anisotropic conductive film, a self-assembly anisotropic conductive paste (SAP) or the like. The lead lines of the circuit board 220 may be electrically connected to the pad portion of the display panel 100. For example, the circuit board 220 may be a flexible film, such as a flexible printed circuit board (FPCB), a printed circuit board (PCB), or a chip on film (COF).

The power supply unit 230 may be disposed on the circuit board 220 to supply a driving voltage to the display driver 210 and the display panel 100. For example, the power supply unit 230 may generate a driving voltage and supply it to the driving voltage line, and the power supply unit 230 may generate a common voltage and supply it to a low potential line. For example, the driving voltage may be a high potential voltage for driving the light emitting elements, and the common voltage may be a low potential voltage for driving the light emitting elements.

The touch driver 240 may be disposed on the circuit board 220 to measure the capacitance of the touch electrodes. For example, the touch driver 240 may determine whether the user has touched or not, the user's touch position and the like, based on the change in capacitance of the touch electrodes. Here, the user's touch means that an object such as a user's finger or pen is in direct contact with one surface of the display device disposed on the touch electrode layer. The touch driver 240 may determine the user's touch position by distinguishing a portion of the plurality of touch electrodes where the user's touch occurs from a portion where no user's touch occurs.

Figure 2:
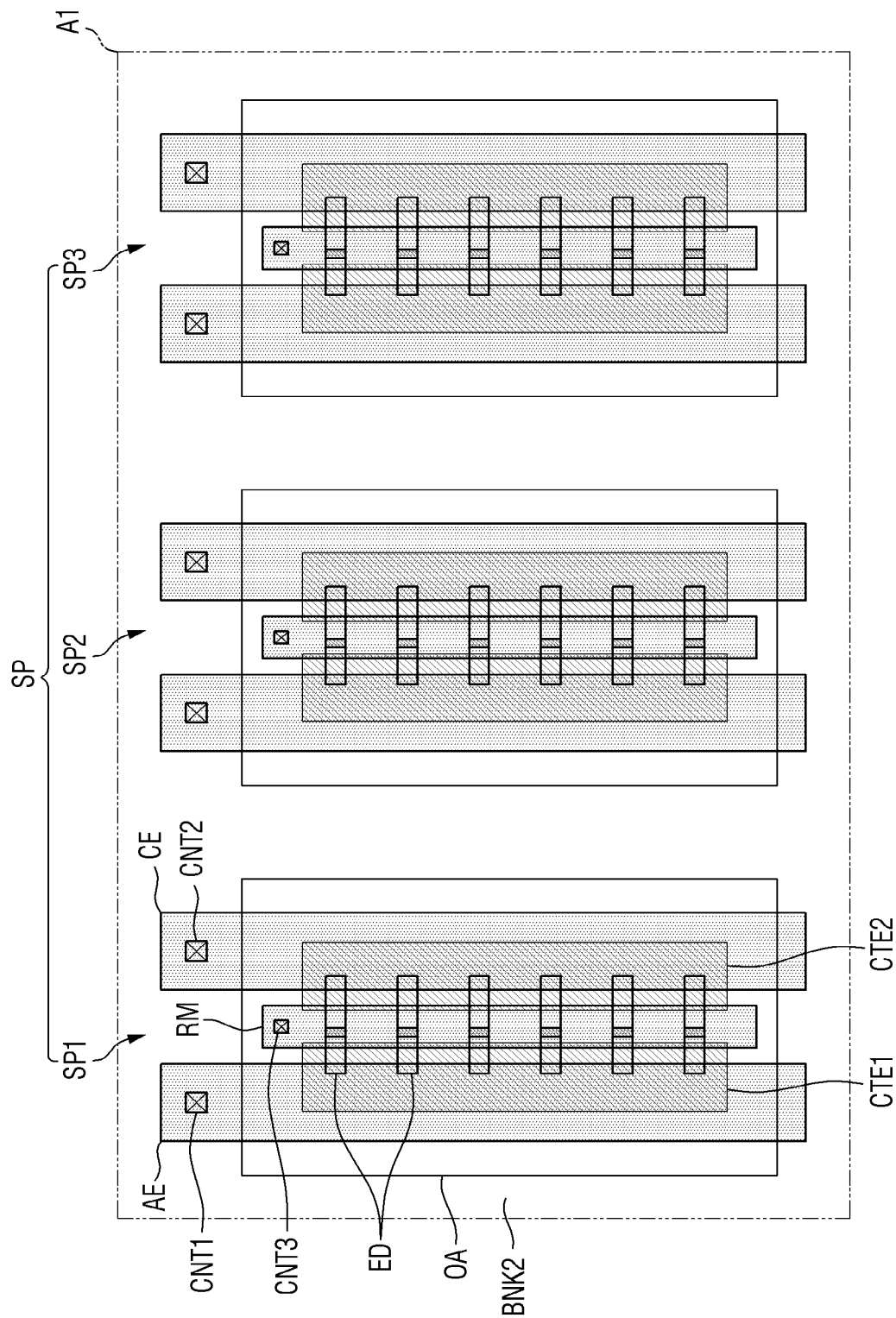
FIG. 2 is an enlarged view of an area A1 of FIG. 1 according to one or more example embodiments of the present disclosure.
Figure 3:
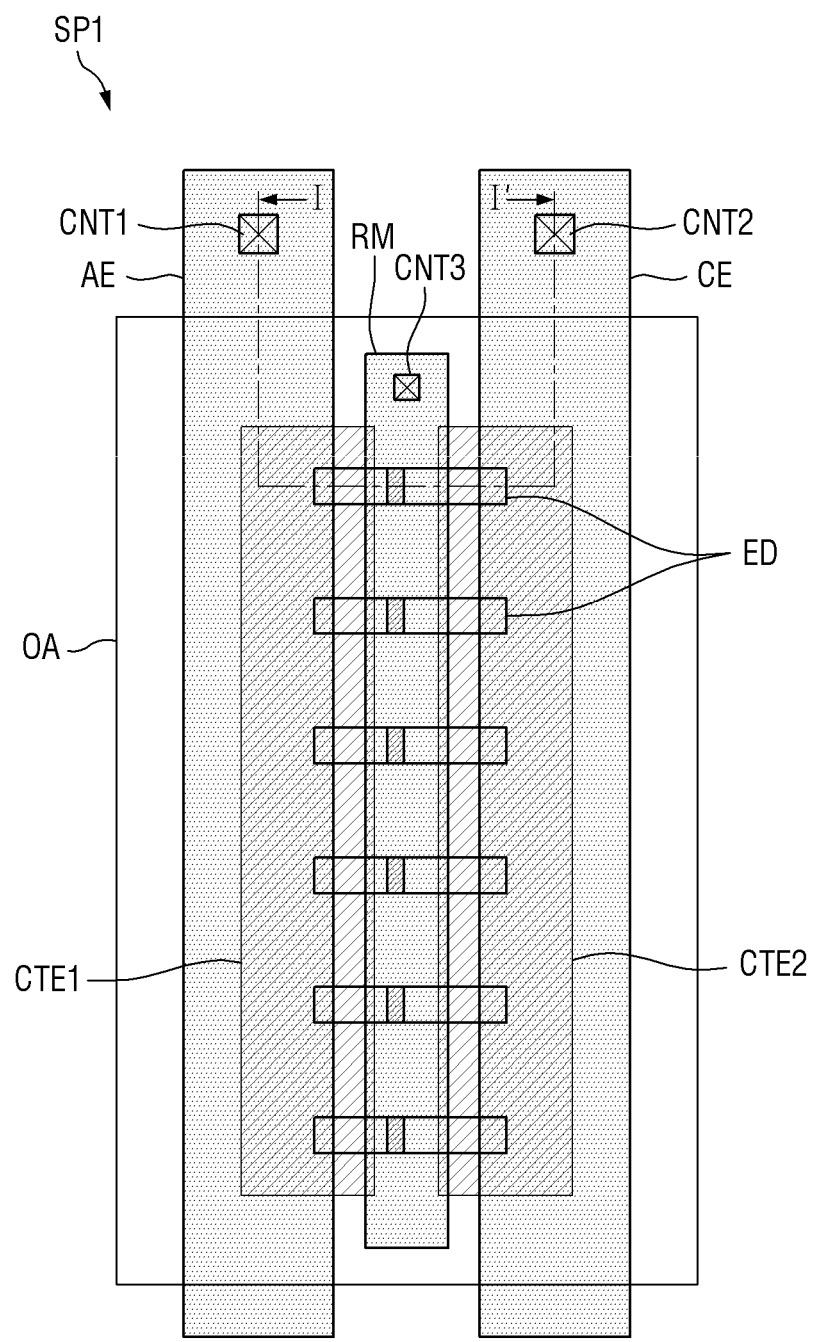
FIG. 3 is a plan view illustrating a first pixel of a display device according to one or more example embodiments of the present disclosure.

FIG. 2 is an enlarged view of an area A1 of FIG. 1 according to one or more example embodiments of the present disclosure. FIG. 3 is a plan view illustrating a first pixel of a display device according to one or more example embodiments of the present disclosure.

Referring to FIGS. 2 and 3, the display device may include a plurality of pixels SP. The pixels SP may include first to third pixels SP1, SP2, and SP3. Each of the first to third pixels SP1, SP2, and SP3 may include a plurality of light emitting elements ED. The light emitting elements ED may emit light toward the front side of the display device through an opening area OA.

Each of the first to third pixels SP1, SP2, and SP3 may emit light of the same color. For example, the first to third pixels SP1, SP2, and SP3 may include the same type of the light emitting elements ED to emit the light of the same color. For another example, the first pixel SP1 may emit light of a first color such as red light, the second pixel SP2 may emit light of a second color such as green light, and the third pixel SP3 may emit light of a third color such as blue light.

Each of the first to third pixels SP1, SP1, and SP3 may include a first electrode AE, a second electrode CE, the light emitting elements ED, a first contact electrode CTE1, a second contact electrode CTE2, an electrode pattern RM, and a second bank BNK2.

Each of the first electrode AE and the second electrode CE may be electrically connected to the light emitting element ED to be applied with a voltage (e.g., a set or predetermined voltage), and the light emitting element ED may emit light in a specific wavelength band. At least one of the first electrode AE or the second electrode CE may form an electric field in the pixel SP, and the light emitting elements ED may be aligned by the electric field.

For example, the first electrode AE may be a separate pixel electrode for each of the first to third pixels SP1, SP2, and SP3, and the second electrode CE may be a common pixel electrode commonly connected to the first to third pixels SP1, SP2 and SP3. One of the first electrode AE and the second electrode CE may be an anode electrode of the light emitting element ED, and the other one may be a cathode electrode of the light emitting element ED.

For example, each of the first electrode AE and the second electrode CE may be a reflective electrode containing at least one of aluminum (Al), magnesium (Mg), gold (Au), silver (Ag), rhodium (Rh), copper (Cu), titanium (Ti), chromium (Cr), nickel (Ni), or palladium (Pd). Each of the first electrode AE and the second electrode CE may reflect light emitted from the light emitting elements ED toward the front side of the display device.

The first electrode AE of each of the first to third pixels SP1, SP2, and SP3 may extend in the second direction (Y-axis direction). The first electrode AE of each of the first to third pixels SP1, SP2, and SP3 may be spaced from the first electrode AE of the adjacent pixel SP. The first electrodes AE of the respective first to third pixels SP1, SP2, and SP3 may be spaced from each other in the arrangement direction (e.g., first direction (X-direction)) of the pixels SP. For example, the first electrodes AE of the pixels SP arranged along the second direction (Y-axis direction) may be disposed on an imaginary extension line extending in the second direction (Y-axis direction) while being spaced from each other. The first electrode AE of each of the first to third pixels SP1, SP2, and SP3 may be connected to a pixel circuit of the pixel SP through a first contact hole CNT1. The first electrodes AE of the respective first to third pixels SP1, SP2, and SP3 may receive different signals from the pixel circuit to be driven separately.

The second electrode CE of each of the first to third pixels SP1, SP2, and SP3 may extend in the second direction (Y-axis direction). The first electrode AE and the second electrode CE of each of the first to third pixels SP1, SP2, and SP3 may be arranged side by side while being spaced from each other. The second electrode CE of each of the first to third pixels SP1, SP2, and SP3 may be spaced from the second electrode CE of the adjacent pixel SP. The second electrodes CE of the respective first to third pixels SP1, SP2, and SP3 may be spaced from each other in the arrangement direction of the pixels SP. For example, the second electrodes CE of the pixels SP arranged along the second direction (Y-axis direction) may be disposed on an imaginary extension line extending in the second direction (Y-axis direction) while being spaced from each other. The second electrode CE of each of the first to third pixels SP1, SP2, and SP3 may be connected to a low potential line through a second contact hole CNT2. The same low potential voltage may be applied to the second electrode CE of each of the first to third pixels SP1, SP2, and SP3 through the low potential line.

The light emitting elements ED may be disposed between the first electrode AE and the second electrode CE. One end of the light emitting element ED may be connected to the first electrode AE, and the other end of the light emitting element ED may be connected to the second electrode CE. For example, the light emitting element ED may be connected to the first electrode AE through the first contact electrode CTE1, and may be connected to the second electrode CE through the second contact electrode CTE2.

The light emitting elements ED may be disposed to be spaced from each other, and may be arranged to be substantially parallel to each other. The distance between the light emitting elements ED is not particularly limited. Some of the light emitting elements ED may be adjacently disposed, others may be spaced from each other at regular intervals, and the others may be arranged in a specific direction with a non-uniform density. For example, each of the light emitting elements ED may be disposed in a direction perpendicular to the extension direction of the first electrode AE or the second electrode CE. For another example, each of the light emitting elements ED may be disposed in a direction oblique to the extension direction of the first electrode AE or the second electrode CE.

The light emitting elements ED may include active layers containing the same material to emit light in the same wavelength band or light of the same color. The first to third pixels SP1, SP2, and SP3 may emit light of the same color. For example, the light emitting elements ED may emit light having a peak wavelength in a range of 440 nm to 480 nm, such as blue light. For another example, the first to third pixels SP1, SP2, and SP3 may include the light emitting elements ED having different active layers to emit light of different colors.

The first contact electrode CTE1 may cover a portion of the first electrode AE and a portion of the light emitting element ED to electrically connect the first electrode AE to the light emitting element ED. The first contact electrode CTE1 may be disposed on the first electrode AE and the light emitting elements ED and may extend in the second direction (Y-axis direction). The first contact electrode CTE1 may be in contact with one end of each of the light emitting elements ED. Accordingly, the light emitting elements ED may be electrically connected to the first electrode AE through the first contact electrode CTE1.

The second contact electrode CTE2 may cover a portion of the second electrode CE and another portion of the light emitting element ED to electrically connect the second electrode CE to the light emitting element ED. The second contact electrode CTE2 may be disposed on the second electrode CE and the light emitting elements ED and may extend in the second direction (Y-axis direction). The second contact electrode CTE2 may be spaced from the first contact electrode CTE1 in the first direction (X-axis direction). The second contact electrode CTE2 may be in contact with the other end of each of the light emitting elements ED. The light emitting elements ED may be electrically connected to the second electrode CE through the second contact electrode CTE2.

The electrode pattern RM may be disposed in the same layer as the first electrode AE and the second electrode CE. The electrode pattern RM may be made of the same material as the first electrode AE and the second electrode CE, but is not limited thereto. The electrode pattern RM may be disposed between the first electrode AE and the second electrode CE, and may overlap the light emitting elements ED in the thickness direction. When the first electrode AE and the second electrode CE extend in the second direction (Y-axis direction) and are spaced from each other in the first direction (X-axis direction), the electrode pattern RM may extend in the second direction (Y-axis direction) between the first electrode AE and the second electrode CE. The electrode pattern RM may be spaced from the first electrode AE and the second electrode CE and may be insulated from the first electrode AE and the second electrode CE by an insulating film or a protective film.

For example, the electrode pattern RM may be a reflective electrode containing at least one of aluminum (Al), magnesium (Mg), gold (Au), silver (Ag), rhodium (Rh), copper (Cu), titanium (Ti), chromium (Cr), nickel (Ni) or palladium (Pd). The electrode pattern RM may reflect light emitted from the light emitting elements ED to the first electrode AE or the second electrode CE. Each of the first electrode AE and the second electrode CE may reflect the light received from the electrode pattern RM toward the front side of the display device. The electrode pattern RM may also directly reflect the light emitted from the light emitting elements ED toward the front side of the display device.

For example, the electrode pattern RM may be electrically floated. For another example, the electrode pattern RM may be grounded to a specific voltage through a third contact hole CNT3.

The second bank BNK2 may be disposed at a boundary between the adjacent pixels SP. The second bank BNK2 may define opening areas OA of the first to third pixels SP1, SP2, and SP3. The second banks BNK2 may be arranged in a lattice shape to be disposed at the boundaries of the pixels SP. The second bank BNK2 may also be disposed at the boundary of the pixels SP arranged along the second direction (Y-axis direction).

In the fabrication of the display device, the second bank BNK2 may prevent ink from crossing the boundary of the pixels SP when spraying ink to form dispersed light emitting elements ED. The second bank BNK2 may separate the ink sprayed into the dispersed different light emitting elements ED not to be mixed with each other.

Figure 4:
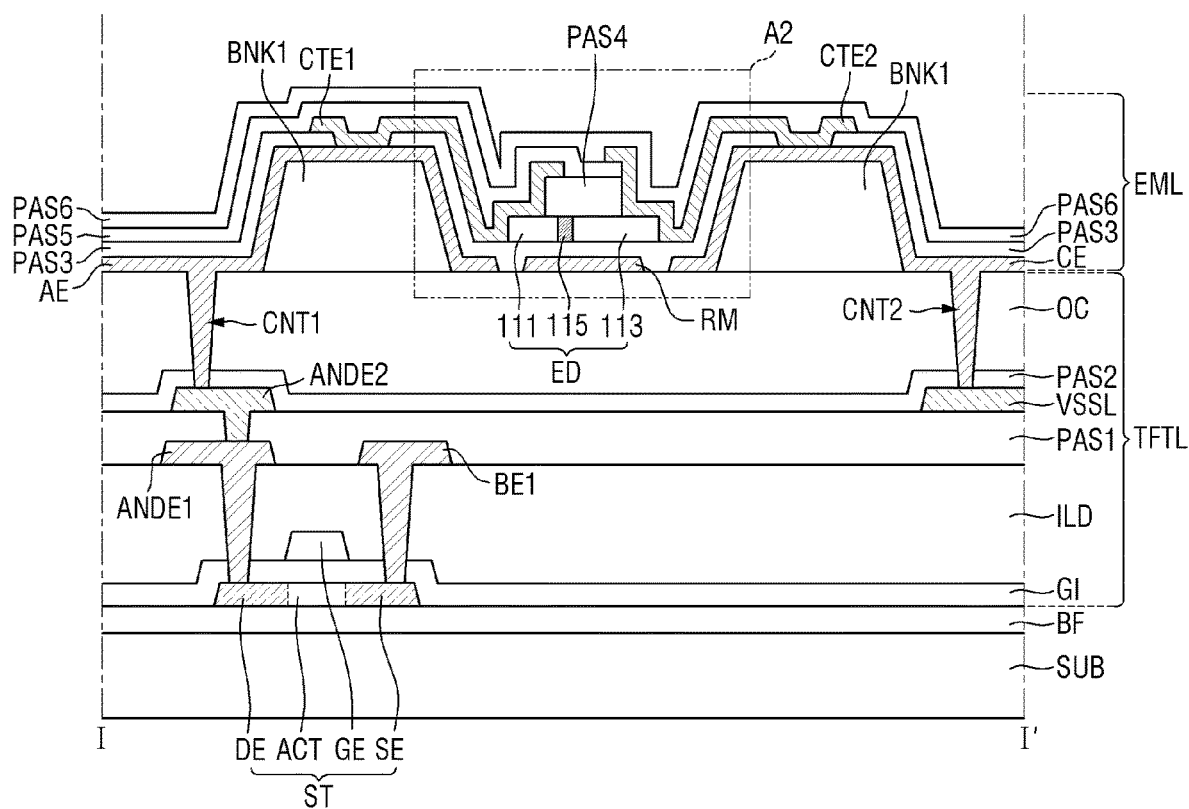
FIG. 4 is a cross-sectional view taken along the line I-I' of FIG. 3 according to one or more example embodiments of the present disclosure.
Figure 5:
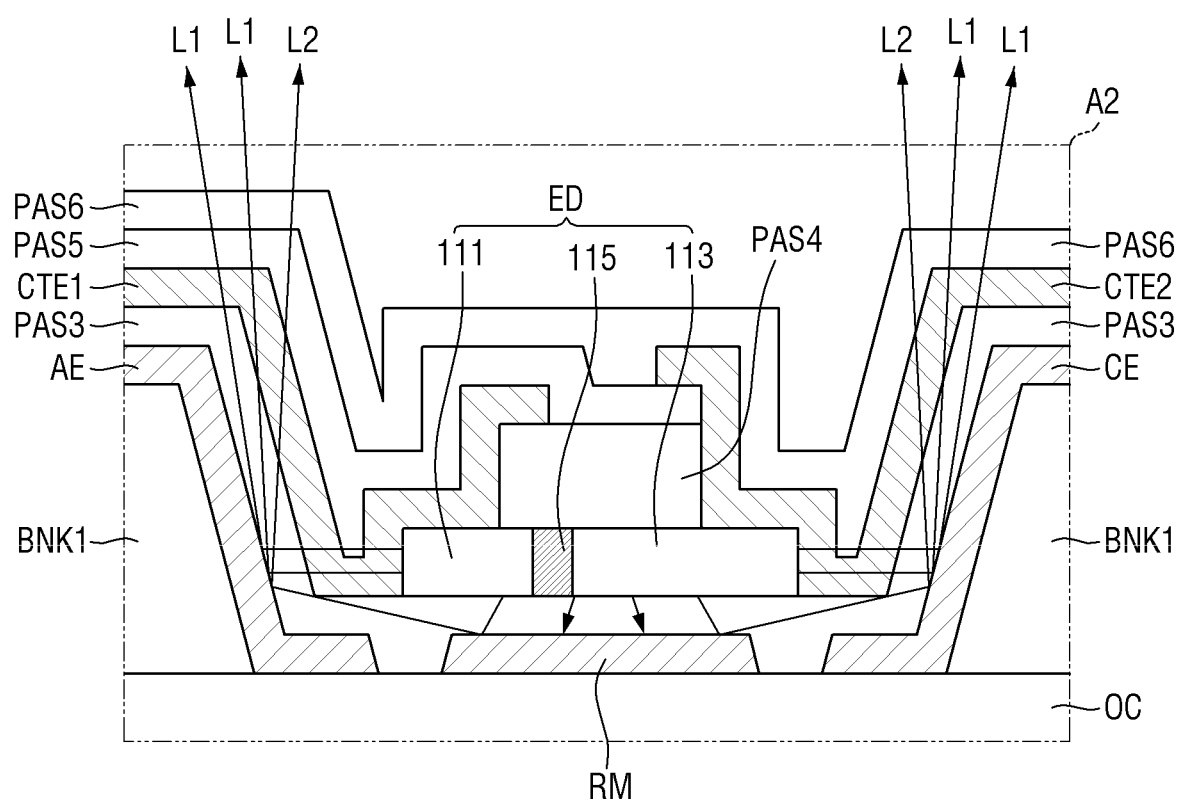
FIG. 5 is an enlarged view of an area A2 of FIG. 4.
Figure 6:
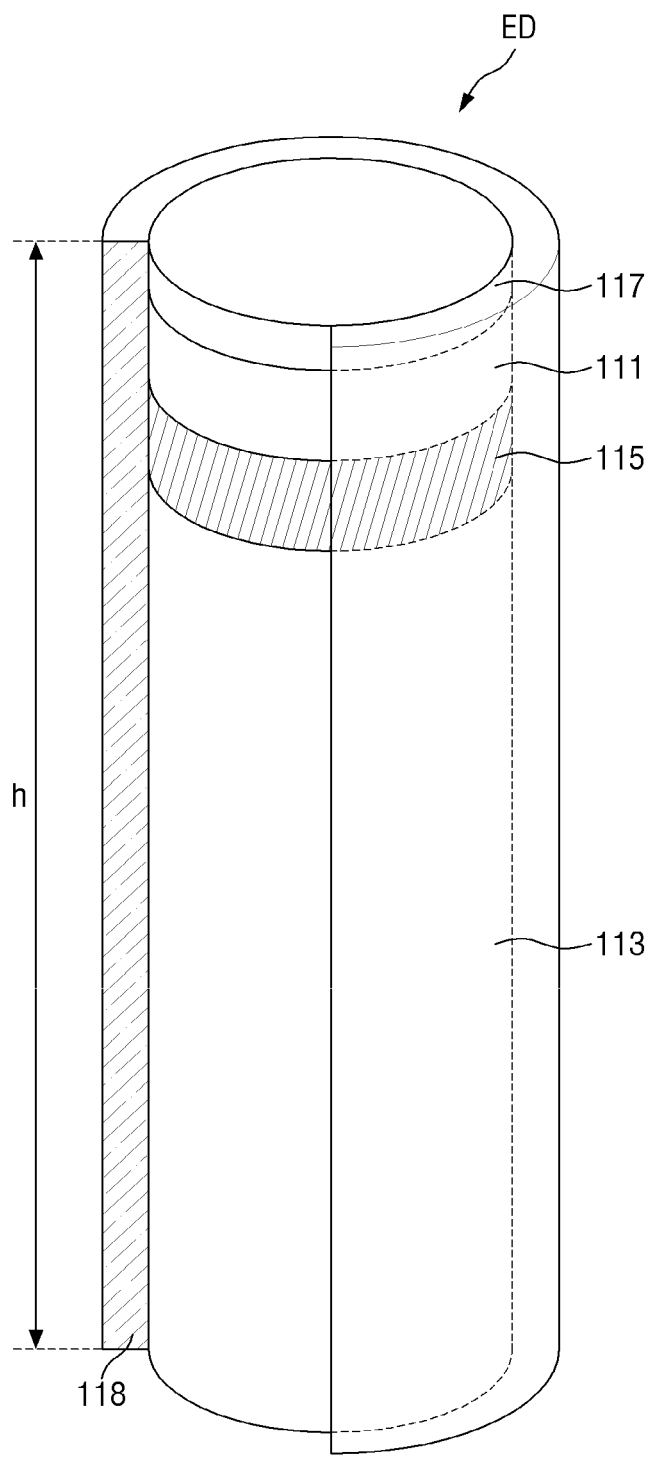
FIG. 6 is a perspective view showing a light emitting element of a display device according to one or more example embodiments of the present disclosure.

FIG. 4 is a cross-sectional view taken along the line I-I' of FIG. 3 according to one or more example embodiments of the present disclosure. FIG. 5 is an enlarged view of an area A2 of FIG. 4. FIG. 6 is a perspective view showing a light emitting element of a display device according to one or more example embodiments of the present disclosure.

Referring to FIGS. 4-6, the display device may include a substrate SUB, a buffer layer BF, a thin film transistor layer TFTL, and a light emitting element layer EML.

The substrate SUB may be a base substrate or a base member, and may be made of an insulating material such as a polymer resin. For example, the substrate SUB may be a rigid substrate. When the substrate SUB is a rigid substrate, the substrate SUB may include a glass material or a metal material, but is not limited thereto. In another example, the substrate SUB may be a flexible substrate which can be bent, folded and rolled. When the substrate SUB is a flexible substrate, the substrate SUB may include polyimide (PI), but is not limited thereto.

The buffer layer BF may be disposed on the substrate SUB. The buffer layer BF may be made in the form of an inorganic film that is capable of preventing air or moisture infiltration. For example, the buffer layer BF may include a plurality of inorganic films laminated alternately.

The thin film transistor layer TFTL may include a thin film transistor ST, a gate insulating film GI, an interlayer insulating film ILD, first and second passivation layers PAS1 and PAS2, first and second anode connection electrodes ANDE1 and ANDE2, a first connection electrode BE1, a low potential line VSSL, and a planarization layer OC.

The thin film transistor ST may be disposed on the buffer layer BF, and may constitute a pixel circuit of each of the plurality of pixels SP. For example, the thin film transistor ST may be a switching transistor of the pixel circuit. The thin film transistor ST may include a semiconductor region ACT, a gate electrode GE, a source electrode SE, and a drain electrode DE.

The semiconductor region ACT may be provided on the buffer layer BF. The semiconductor region ACT may overlap the gate electrode GE. The semiconductor region ACT may be disposed between the source electrode SE and the drain electrode DE, and may overlap the gate electrode GE in the thickness direction.

The source electrode SE and the drain electrode DE may be provided on the buffer layer BF. The source electrode SE and the drain electrode DE may be formed by making portions of the semiconductor region ACT to be conductive. The source electrode SE may be connected to the first connection electrode BE1, and the drain electrode DE may be connected to the first anode connection electrode ANDE1.

The gate electrode GE may be arranged on the gate insulating film GI. The gate electrode GE may overlap the semiconductor region ACT in the thickness direction. The gate electrode GE may be insulated from the semiconductor region ACT by the gate insulating film GI.

The gate insulating film GI may be disposed on the semiconductor region ACT, the source electrode SE, and the drain electrode DE of the thin film transistor ST. The gate insulating film GI may insulate the semiconductor region ACT from the gate electrode GE in the thin film transistor ST. For example, the gate insulating film GI may include a contact hole through which the first anode connection electrode ANDE1 passes to be in contact with the drain electrode DE of the thin film transistor ST and a contact hole through which the first connection electrode BE1 passes to be in contact with the source electrode SE of the thin film transistor ST.

The interlayer insulating film ILD may be disposed on the gate electrode GE of the thin film transistor ST. For example, the interlayer insulating film ILD may include a contact hole through which the first anode connection electrode ANDE1 passes and a contact hole through which the first connection electrode BE1 passes. The contact holes of the interlayer insulating film ILD may be connected to the contact holes of the gate insulating film GI.

The first anode connection electrode ANDE1 and the first connection electrode BE1 may be disposed on the interlayer insulating film ILD. The first anode connection electrode ANDE1 and the first connection electrode BE1 may be disposed to be spaced from each other on the interlayer insulating film ILD. The first anode connection electrode ANDE1 may connect the drain electrode DE of the thin film transistor ST to the second anode connection electrode ANDE2. The first connection electrode BE1 may connect the source electrode SE of the thin film transistor ST to another thin film transistor or a voltage line.

The first passivation layer PAS1 may be disposed on the first anode connection electrode ANDE1 and the first connection electrode BE1 to protect the thin film transistor ST. For example, the first passivation layer PAS1 may include a contact hole through which the second anode connection electrode ANDE2 passes to be in contact with the drain electrode DE of the thin film transistor ST via the first anode connection electrode ANDE1.

The second anode connection electrode ANDE2 and the low potential line VSSL may be disposed on the first passivation layer PAS1. The second anode connection electrode ANDE2 and the low potential line VSSL may be disposed to be spaced from each other on the first passivation layer PAS1. The second anode connection electrode ANDE2 may connect the first electrode AE to the first anode connection electrode ANDE1 and the drain electrode DE of the thin film transistor ST. The low potential line VSSL may be connected to the second electrode CE.

The second passivation layer PAS2 may be disposed on the second anode connection electrode ANDE2 and the low potential line VSSL to protect the second anode connection electrode ANDE2 and the low potential line VSSL. For example, the second passivation layer PAS2 may include the first contact hole CNT1 through which the first electrode AE passes to be in contact with the second anode connection electrode ANDE2 and the second contact hole CNT2 through which the second electrode CE passes to be in contact with the low potential line VSSL.

The planarization layer OC may be provided on the second passivation layer PAS2 to flatten the top portion of the thin film transistor layer TFTL. For example, the planarization layer OC may include the first contact hole CNT1 through which the first electrode AE passes and the second contact hole CNT2 through which the second electrode CE passes. The contact holes of the planarization layer OC may be connected to the contact holes of the second passivation layer PAS2.

The light emitting element layer EML may include a first bank BNK1, the first electrode AE, the second electrode CE, the electrode pattern RM, a third passivation layer PAS3, the light emitting element ED, a fourth passivation layer PAS4, the first contact electrode CTE1, a fifth passivation layer PAS5, the second contact electrode CTE2, and a sixth passivation layer PAS6.

The first bank BNK1 may be disposed in the opening area OA or an emission area of the pixel SP. Each of the first banks BNK1 may correspond to the first electrode AE or the second electrode CE. Each of the first electrode AE and the second electrode CE may be disposed on the corresponding first bank BNK1. The first bank BNK1 may include polyimide (PI), but is not limited thereto.

The first banks BNK1 may be disposed on the planarization layer OC, and side surfaces of each of first banks BNK1 may be inclined with respect to the planarization layer OC. The light emitting element ED may be disposed between the inclined surfaces of the first banks BNK1, which face each other. Each of the first electrode AE and the second electrode CE may be disposed on the inclined surfaces of the corresponding first bank BNK1.

The first electrode AE may be disposed on the planarization layer OC and the first bank BNK1. For example, the first electrode AE may cover the first bank BNK1 disposed on the planarization layer OC. The first electrode AE may be disposed to overlap the emission area or the opening area OA defined by the second bank BNK2. The first electrode AE may be connected to the second anode connection electrode ANDE2 through the first contact hole CNT1. The first electrode AE may be connected to the drain electrode DE of the thin film transistor ST through the first and second anode connection electrodes ANDE1 and ANDE2. For example, the first electrode AE may be a reflective electrode containing at least one of aluminum (Al), magnesium (Mg), gold (Au), silver (Ag), rhodium (Rh), copper (Cu), titanium (Ti), chromium (Cr), nickel (Ni) or palladium (Pd).

The second electrode CE may be disposed on the planarization layer OC and the first bank BNK1. For example, the second electrode CE may cover the first bank BNK1 disposed on the planarization layer OC. The second electrode CE may be disposed to overlap the emission area or the opening area OA defined by the second bank BNK2. The second electrode CE may be connected to the low potential line VSSL through the second contact hole CNT2. For example, the second electrode CE may be a reflective electrode containing at least one of aluminum (Al), magnesium (Mg), gold (Au), silver (Ag), rhodium (Rh), copper (Cu), titanium (Ti), chromium (Cr), nickel (Ni) or palladium (Pd).

The first electrode AE and the second electrode CE may be respectively disposed on the first banks BNK1 having the inclined surfaces and may include a material having high reflectivity, thereby reflecting first lights L1 emitted from the light emitting element ED toward the front side of the display device. For example, after the first lights L1 are emitted from the both side surfaces of the light emitting element ED, the first lights L1 may be reflected from the first electrode AE and/or the second electrode CE to be emitted toward the front side of the display device.

The electrode pattern RM may be disposed in the same layer as the first electrode AE and the second electrode CE. The electrode pattern RM may be made of the same material as the first electrode AE and the second electrode CE, but is not limited thereto. The electrode pattern RM may be disposed between the first electrode AE and the second electrode CE, and may overlap the light emitting elements ED in the thickness direction. The electrode pattern RM may be disposed between the first banks BNK1 respectively supporting the first electrode AE and the second electrode CE. The electrode pattern RM may be disposed between the plurality of the first banks BNK1 for convenience in the process, but is not limited thereto. The electrode pattern RM may be disposed under the light emitting element ED to reflect light emitted downward from the light emitting element ED in the upper direction of the light emitting element ED. The electrode pattern RM may be spaced from the first electrode AE and the second electrode CE, and may be insulated from the first electrode AE and the second electrode CE by the third passivation layer PAS3. For example, the electrode pattern RM may be a reflective electrode containing at least one of aluminum (Al), magnesium (Mg), gold (Au), silver (Ag), rhodium (Rh), copper (Cu), titanium (Ti), chromium (Cr), nickel (Ni) or palladium (Pd).

The electrode pattern RM may reflect second lights L2 emitted from the light emitting elements ED to the first electrode AE and/or the second electrode CE. Each of the first electrode AE and the second electrode CE may reflect the second light L2 received from the electrode pattern RM toward the front side of the display device. For example, after the second light L2 is emitted from the bottom of the light emitting element ED, the electrode pattern RM may reflect the second light L2 toward the first electrode AE or the second electrode CE. Then, the first electrode AE or the second electrode CE may reflect the second light L2 toward the front side of the display device. The electrode pattern RM may also directly reflect the lights emitted from the light emitting elements ED toward the front side of the display device.

The display device includes the electrode pattern RM disposed between the first electrode AE and the second electrode CE in the same layer as the first electrode AE and the second electrode CE, so that the loss of light emitted downward from the light emitting element ED can be decreased. Because the electrode pattern RM is formed of the same material as the first electrode AE and the second electrode CE in the same layer, a separate mask process may not be necessary. Consequently, because the display device includes the electrode pattern RM that overlaps the light emitting elements ED in the thickness direction and contains the reflective material, it is possible to enhance the light emission efficiency of the light emitting elements ED, thereby improving the luminance of the display device.

For example, the electrode pattern RM may be electrically floated. For another example, the electrode pattern RM may be grounded to the specific voltage through the third contact hole CNT3.

The third passivation layer PAS3 may cover the electrode pattern RM, at least a portion of the first electrode AE, and at least a portion of the second electrode CE. The third passivation layer PAS3 may insulate the electrode pattern RM, the first electrode AE, and the second electrode CE from each other. For example, the third passivation layer PAS3 may include an inorganic insulating material. The third passivation layer PAS3 may include contact holes through which the first contact electrode CTE1 and the second contact electrode CTE2 respectively passes to be in contact with the first electrode AE and the second electrode CE.

The light emitting element ED may be disposed between the first electrode AE and the second electrode CE on the third passivation layer PAS3. The light emitting element ED may overlap the electrode pattern RM in the thickness direction, and may be spaced from the electrode pattern RM with the third passivation layer PAS3 interposed therebetween. One end of the light emitting element ED may be connected to the first electrode AE through the first contact electrode CTE1, and the other end of the light emitting element ED may be connected to the second electrode CE through the second contact electrode CTE2. For example, the light emitting elements ED may include active layers 115 containing the same material to emit light in the same wavelength band or light of the same color. For example, the light emitting elements ED may emit light having a peak wavelength in the range of 440 nm to 480 nm, such as blue light. Therefore, the light emitting element layer EML may emit blue light.

The light emitting element ED may include a first semiconductor portion 111, a second semiconductor portion 113, the active layer 115, an electrode layer 117, and an insulating layer 118.

The first semiconductor portion 111 may be disposed on the active layer 115. The first semiconductor portion 111 may be connected to the first electrode AE through the electrode layer 117 and the first contact electrode CTE1. For example, when the light emitting element ED emits blue or green light, the first semiconductor portion 111 may include a semiconductor material having a chemical formula of $Al_xGa_yIn_{1-x-y}N$ ($0 \le x \le 1$, $0 \le y \le 1$, $0 \le x+y \le 1$). For example, the first semiconductor portion 111 may include at least one semiconductor material of p-type doped AlGaInN, GaN, AlGaN, InGaN, AlN, or InN. The first semiconductor portion 111 may be doped with p-type dopants such as Mg, Zn, Ca, Se, and Ba. The first semiconductor portion 111 may be p-type Mg-doped p-GaN. The length of the first semiconductor portion 111 may have a range of 0.05 μm to 0.10 μm, but is not limited thereto.

The second semiconductor portion 113 may be connected to the second electrode CE through the second contact electrode CTE2. The second semiconductor portion 113 may be an n-type semiconductor. For example, when the light emitting element ED emits blue light, the second semiconductor portion 113 may include a semiconductor material having a chemical formula of $Al_xGa_yIn_{1-x-y}N$ ($0 \le x \le 1$, $0 \le y \le 1$, $0 \le x+y \le 1$). The second semiconductor portion 113 may include at least one semiconductor material of n-type doped AlGaInN, GaN, AlGaN, InGaN, AlN, or InN. The second semiconductor portion 113 may be doped with n-type dopants such as Si, Ge, and Sn. The second semiconductor portion 113 may be n-type Si-doped n-GaN. The length of the second semiconductor portion 113 may have a range of 1.5 μm to 5 μm, but is not limited thereto.

Each of the first and second semiconductor portions 111 and 113 may be formed as a single layer, but the present disclosure is not limited thereto. For example, each of the first and second semiconductor portions 111 and 113 may further include a clad layer or a tensile strain barrier reducing (TSBR) layer to be formed to have a multilayer structure.

The active layer 115 may be disposed between the first and second semiconductor portions 111 and 113. The active layer 115 may include a material having a single or multiple quantum well structure. When the active layer 115 includes a material having a multiple quantum well structure, a plurality of quantum layers and well layers may be stacked alternately. The active layer 115 may emit light by coupling of electron-hole pairs according to an electric signal applied through the first and second semiconductor portions 111 and 113. For example, when the active layer 115 includes a material such as AlGaN, AlGaInN or the like, the active layer 115 may emit blue light. When the active layer 115 has a multiple quantum well structure in which quantum layers and well layers are alternately stacked, the quantum layer may include a material such as AlGaN or AlGaInN, and the well layer may include a material such as GaN or AlInN. The active layer 115 may emit blue light by including the quantum layer made of AlGaInN and the well layer made of AlInN.

As another example, the active layer 115 may have a structure in which semiconductor materials having large band gap energy and semiconductor materials having small band gap energy are alternately stacked, and may include Group III to V semiconductor materials according to the wavelength band of the emitted light. The light emitted by the active layer 115 is not limited to blue light, and the active layer 115 may emit red or green light in some cases. The length of the active layer 115 may have a range of 0.05 μm to 0.10 μm, but is not limited thereto.

Light emitted from the active layer 115 may be emitted in the longitudinal direction of the light emitting element ED, and may also be emitted from both side surfaces. The directionality of the light emitted from the active layer 115 may not be limited.

The electrode layer 117 may be an ohmic contact electrode. As another example, the electrode layer 117 may be a Schottky contact electrode. The light emitting element ED may include at least one electrode layer 117. The electrode layer 117 may reduce resistance between the light emitting element ED and the first contact electrode CTE1 when the light emitting element ED is connected to the first contact electrode CTE1. The electrode layer 117 may contain conductive metal. For example, the electrode layer 117 may include at least one of aluminum (Al), titanium (Ti), indium (In), gold (Au), silver (Ag), indium tin oxide (ITO), indium zinc oxide (IZO), or indium tin zinc oxide (ITZO). The electrode layer 117 may include an n-type or p-type doped semiconductor material.

The insulating layer 118 may surround the outer surfaces of the first and second semiconductor portions 111 and 113, the active layer 115, and the electrode layer 117. The insulating layer 118 may protect the light emitting element ED. For example, the insulating layer 118 may surround the side surface of the light emitting element ED, and may expose the both ends of the light emitting element ED in the longitudinal direction.

The insulating layer 118 may include materials having insulating properties, for example, silicon oxide (SiOx), silicon nitride (SiNx), silicon oxynitride (SiOxNy), aluminum nitride (AlN), aluminum oxide ($A_2O_3$), and the like. Accordingly, the insulating layer 118 may prevent an electrical short circuit that may occur when the active layer 115 is in direct contact with the electrode through which the electrical signal is transmitted to the light emitting element ED. The insulating layer 118 protects the outer surface of the light-emitting element ED including the active layer 115, thereby preventing a decrease in luminous efficiency.

The outer surface of the insulating layer 118 may be surface-treated. When manufacturing the display panel 100, the light emitting elements ED may be aligned by being sprayed on the electrodes in a state of being dispersed in an ink (e.g., a set or predetermined ink). The surface of the insulating layer 118 may be subjected to a hydrophobic or hydrophilic treatment, so that the light emitting element ED can maintain a dispersed state without being aggregated with other adjacent light emitting elements ED in the ink.

The fourth passivation layer PAS4 may cover the central portion of each of the light emitting elements ED to fix each of the light emitting elements ED on the third passivation layer PAS3. The both ends of each of the light emitting elements ED may be exposed without being covered by the fourth passivation layer PAS4. The fourth passivation layer PAS4 may separate the first contact electrode CTE1 from the second semiconductor portion 113 of the light emitting element ED.

The first contact electrode CTE1 may partially cover the fourth passivation layer PAS4. The first contact electrode CTE1 may cover a portion of the light emitting element ED and a portion of the third passivation layer PAS3, and may be connected to the first electrode AE through the contact hole provided in the third passivation layer PAS3. The first contact electrode CTE1 may be in contact with one end of the light emitting element ED. The first contact electrode CTE1 may be in contact with the electrode layer 117 of the light emitting element ED to be connected to the first semiconductor portion 111. The first contact electrode CTE1 may electrically connect the first electrode AE to the light emitting element ED. Accordingly, each of the light emitting elements ED may be electrically connected to the first electrode AE through the first contact electrode CTE1.

The fifth passivation layer PAS5 may cover the third passivation layer PAS3, the first contact electrode CTE1, and the fourth passivation layer PAS4. The fifth passivation layer PAS5 may insulate the first contact electrode CTE1 from the second contact electrode CTE2.

The second contact electrode CTE2 may cover a portion of the third passivation layer PAS3, a portion of the second electrode CE, another portion of the light emitting element ED, and a portion of the fifth passivation layer PAS5. The second contact electrode CTE2 may electrically connect the second electrode CE to the light emitting element ED. The second contact electrode CTE2 may be spaced from the first contact electrode CTE1. The second contact electrode CTE2 may be in contact with the other end of the light emitting element ED. The second contact electrode CTE2 may be in contact with the second semiconductor portion 113 of the light emitting element ED. Accordingly, each of the light emitting elements ED may be electrically connected to the second electrode CE through the second contact electrode CTE2.

The sixth passivation layer PAS6 may cover the fifth passivation layer PAS5, the second contact electrode CTE2, and the third passivation layer PAS3. Therefore, the sixth passivation layer PAS6 may prevent the penetration of impurities such as moisture or air from the outside, thereby preventing damage to the light emitting elements ED.

Figure 7:
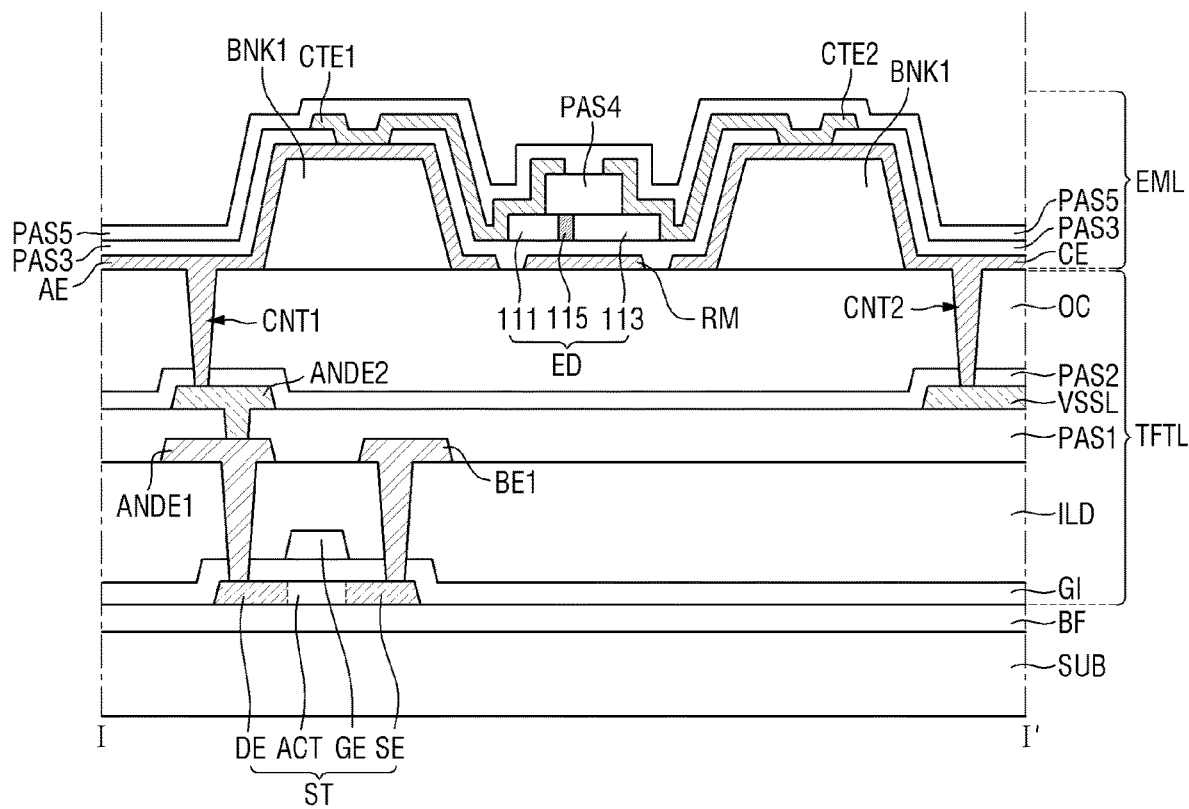
FIG. 7 is a cross-sectional view taken along the line I-I' of FIG. 3 according to one or more example embodiments of the present disclosure.

FIG. 7 is a cross-sectional view taken along the line I-I' of FIG. 3 according to one or more example embodiments of the present disclosure. The display device illustrated in FIG. 7 is different from the display device illustrated in FIG. 4 in the light emitting element layer EML. The same configuration as the above-described configuration will be briefly described or omitted.

Referring to FIG. 7, the display device may include the substrate SUB, the buffer layer BF, the thin film transistor layer TFTL, and the light emitting element layer EML.

The light emitting element layer EML may include the first bank BNK1, the first electrode AE, the second electrode CE, the electrode pattern RM, the third passivation layer PAS3, the light emitting element ED, the fourth passivation layer PAS4, the first contact electrode CTE1, the second contact electrode CTE2, and the fifth passivation layer PAS5.

The first bank BNK1 may be disposed in the opening area OA or the emission area of the pixel SP. The first banks BNK1 may be disposed on the planarization layer OC, and the side surfaces of each of the first banks BNK1 may be inclined with respect to the planarization layer OC. Each of the first banks BNK1 may correspond to the first electrode AE or the second electrode CE.

The first electrode AE may cover the first bank BNK1 disposed on the planarization layer OC. The first electrode AE may be connected to the drain electrode DE of the thin film transistor ST through the first and second anode connection electrodes ANDE1 and ANDE2.

The second electrode CE may cover the first bank BNK1 disposed on the planarization layer OC. The second electrode CE may be connected to the low potential line VSSL through the second contact hole CNT2.

The electrode pattern RM may be disposed in the same layer as the first electrode AE and the second electrode CE. The electrode pattern RM may be made of the same material as the first electrode AE and the second electrode CE, but is not limited thereto. The electrode pattern RM may be disposed between the first electrode AE and the second electrode CE, and may overlap the light emitting elements ED in the thickness direction. The electrode pattern RM may be disposed under the light emitting element ED to reflect light emitted downward from the light emitting element ED in the upper direction of the light emitting element ED. The electrode pattern RM may be spaced from the first electrode AE and the second electrode CE, and may be insulated from the first electrode AE and the second electrode CE by the third passivation layer PAS3. For example, the electrode pattern RM may be a reflective electrode containing at least one of aluminum (Al), magnesium (Mg), gold (Au), silver (Ag), rhodium (Rh), copper (Cu), titanium (Ti), chromium (Cr), nickel (Ni) or palladium (Pd).

The electrode pattern RM may reflect light emitted from the light emitting elements ED to the first electrode AE or the second electrode CE. Each of the first electrode AE and the second electrode CE may reflect the light received from the electrode pattern RM toward the front side of the display device. For example, after light is emitted from the bottom of the light emitting element ED, the electrode pattern RM may reflect the light toward the first electrode AE or the second electrode CE. Then, the first electrode AE or the second electrode CE may reflect the light toward the front side of the display device. The electrode pattern RM may also directly reflect the light emitted from the light emitting elements ED toward the front side of the display device.

The display device includes the electrode pattern RM disposed between the first electrode AE and the second electrode CE in the same layer as the first electrode AE and the second electrode CE, so that the loss of light emitted downward from the light emitting element ED can be decreased. Because the electrode pattern RM is formed of the same material as the first electrode AE and the second electrode CE in the same layer, a separate mask process may not be necessary. Consequently, because the display device includes the electrode pattern RM that overlaps the light emitting elements ED in the thickness direction and contains the reflective material, it is possible to enhance the light emission efficiency of the light emitting elements ED, thereby improving the luminance of the display device.

The third passivation layer PAS3 may cover the electrode pattern RM, at least a portion of the first electrode AE, and at least a portion of the second electrode CE.

The light emitting element ED may be disposed between the first electrode AE and the second electrode CE on the third passivation layer PAS3. The light emitting element ED may overlap the electrode pattern RM in the thickness direction, and may be spaced from the electrode pattern RM with the third passivation layer PAS3 interposed therebetween. One end of the light emitting element ED may be connected to the first electrode AE through the first contact electrode CTE1, and the other end of the light emitting element ED may be connected to the second electrode CE through the second contact electrode CTE2.

The first contact electrode CTE1 may cover a portion of the fourth passivation layer PAS4. The first contact electrode CTE1 may cover a portion of the light emitting element ED and a portion of the third passivation layer PAS3, and may be connected to the first electrode AE through the contact hole provided in the third passivation layer PAS3. The first contact electrode CTE1 may be in contact with one end of the light emitting element ED.

The second contact electrode CTE2 may cover another portion of the fourth passivation layer PAS4. The second contact electrode CTE2 may be spaced from the first contact electrode CTE1 to be insulated therefrom by the fourth passivation layer PAS4. The second contact electrode CTE2 may cover another portion of the light emitting element ED and another portion of the third passivation layer PAS3, and may be connected to the second electrode CE through the contact hole provided in the third passivation layer PAS3. The second contact electrode CTE2 may be in contact with the other end of the light emitting element ED.

The fifth passivation layer PAS5 may cover the third passivation layer PAS3, the first contact electrode CTE1, the second contact electrode CTE2, and the fourth passivation layer PAS4. Therefore, the fifth passivation layer PAS5 may prevent the penetration of impurities such as moisture or air from the outside, thereby preventing the damage to the light emitting elements ED.

Figure 8:
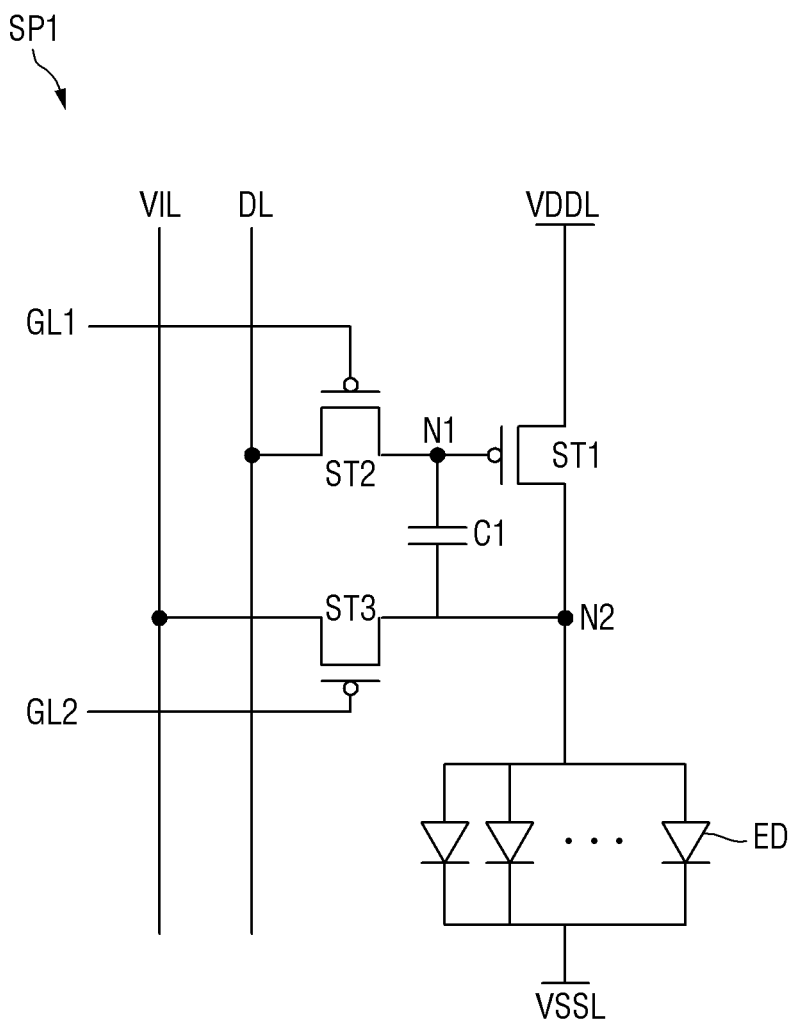
FIG. 8 is a circuit diagram of a first pixel of a display device according to one or more example embodiments of the present disclosure.

FIG. 8 is a circuit diagram of a first pixel of a display device according to one or more example embodiments of the present disclosure.

Referring to FIG. 8, the first pixel SP1 may be connected to a first gate line GL1, a second gate line GL2, a data line DL, a driving voltage line VDDL, a low voltage line VSSL, and an initialization voltage line VIL.

The first pixel SP1 may include a plurality of switching elements, a capacitor C1, and the light emitting elements ED. The switching elements may include first to third transistors ST1, ST2, and ST3.

The first transistor ST1 may include a gate electrode, a source electrode, and a drain electrode. The gate electrode of the first transistor ST1 may be connected to a first node N1, the source electrode thereof may be connected to the driving voltage line VDDL, and the drain electrode thereof may be connected to a second node N2. The first transistor ST1 may control a source-drain current Isd (or driving current) according to a data voltage (hereinafter referred to as "Vdata") applied to the gate electrode from the data line DL via the second transistor ST2. The first transistor ST1 may supply the driving current to the first electrode AE through the second node N2, and the light emitting elements ED may receive the driving current through the first electrode AE.

The light emitting elements ED may emit light by receiving the driving current. The emission amount or the luminance of the light emitting element ED may be proportional to the magnitude of the driving current. The light emitting element ED may be an inorganic light emitting element including an inorganic semiconductor. The light emitting elements ED may be connected to the second node N2 through the first electrode AE. The first electrode AE may be connected to the drain electrode of the first transistor ST1 and the drain electrode of the third transistor ST3 through the second node N2.

The second transistor ST2 may be turned on by receiving a gate on signal from the first gate line GL1 to connect the data line DL to the first node N1 which is connected to the gate electrode of the first transistor ST1. The second transistor ST2 may be turned on according to the received gate on signal to supply the data voltage Vdata to the first node N1. The gate electrode of the second transistor ST2 may be connected to the first gate line GL1, the source electrode thereof may be connected to the data line DL, and the drain electrode thereof may be connected to the first node N1. The drain electrode of the second transistor ST2 may be connected to the gate electrode of the first transistor ST1 and a first electrode of the capacitor C1 through the first node N1.

The third transistor ST3 may be turned on by receiving a gate on signal from the second gate line GL2 to connect the initialization voltage line VIL to the second node N2 which is the drain electrode of the first transistor ST1. The third transistor ST3 may be turned on according to the received gate on signal to supply an initialization voltage VI to the second node N2. The gate electrode of the third transistor ST3 may be connected to the second gate line GL2, the source electrode thereof may be connected to the initialization voltage line VIL, and the drain electrode thereof may be connected to the second node N2. The drain electrode of the third transistor ST3 may be connected to the drain electrode of the first transistor ST1, a second electrode of the capacitor C1, and the first electrode AE through the second node N2.

Figure 9:
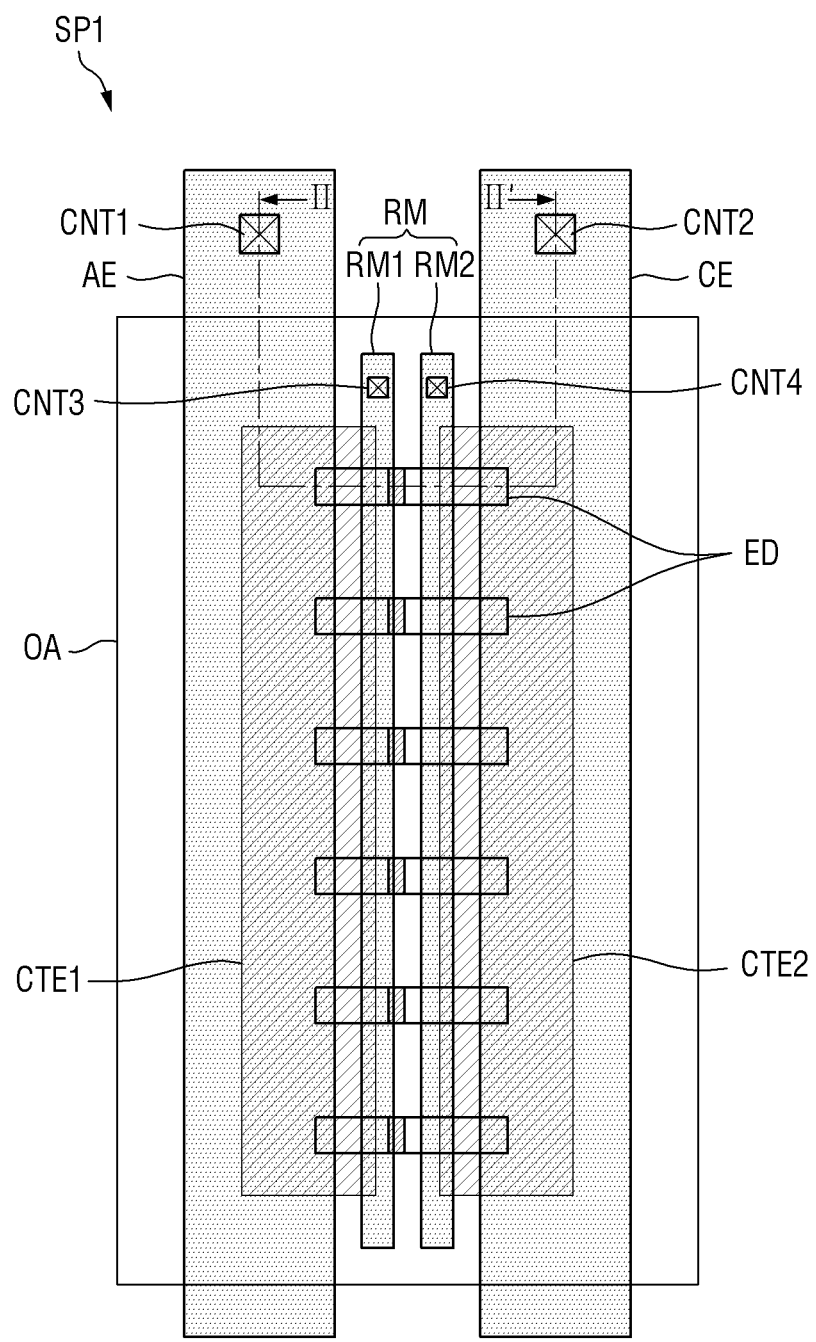
FIG. 9 is a plan view illustrating a first pixel of a display device according to another example embodiment of the present disclosure.
Figure 10:
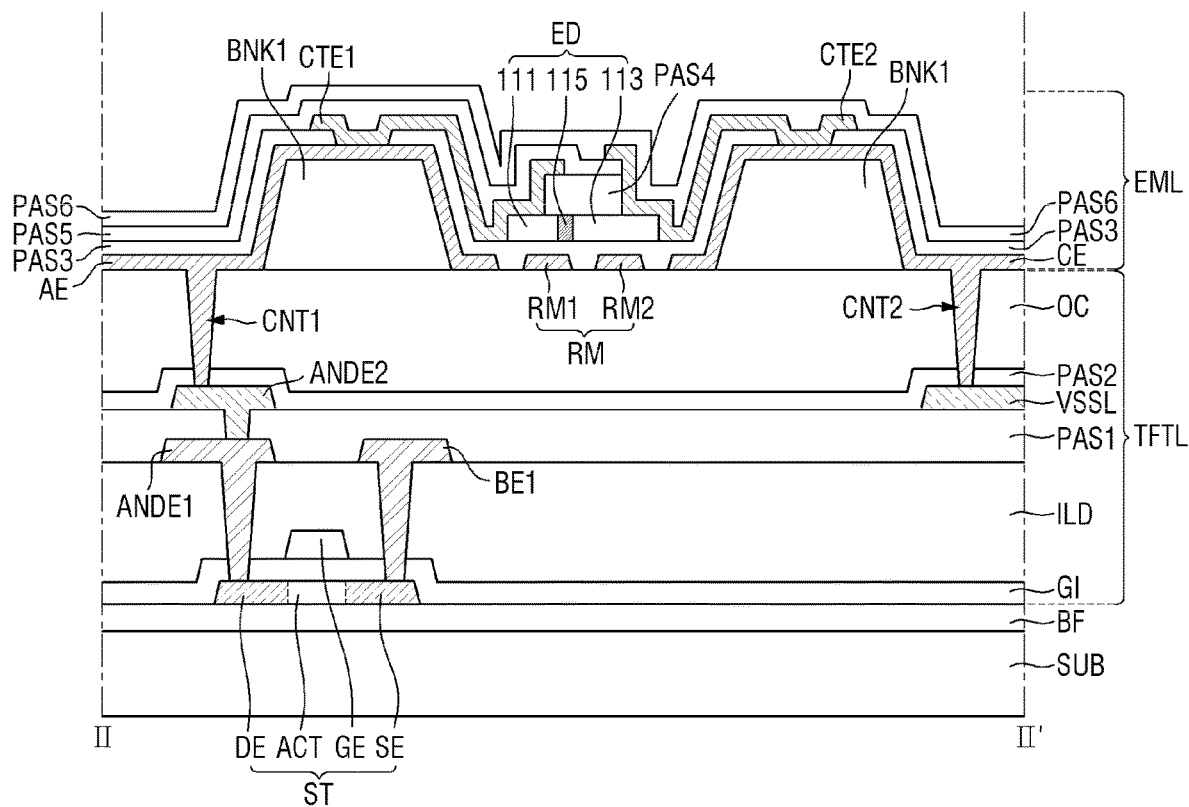
FIG. 10 is a cross-sectional view of the first pixel of a display device taken along the line II-II' of FIG. 9 according to one or more example embodiments of the present disclosure.
Figure 11:
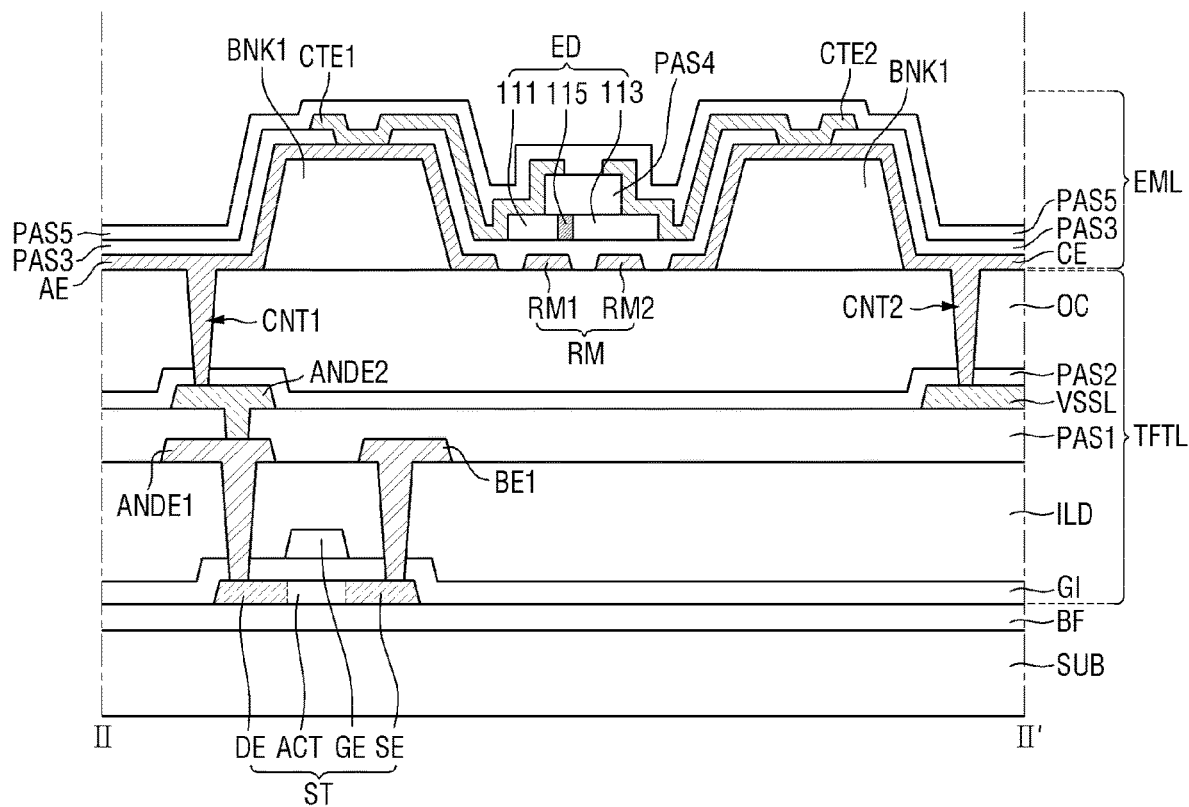
FIG. 11 is a cross-sectional view of a first pixel of a display device taken along the line II-II' of FIG. 9 according to another example embodiment of the present disclosure.

FIG. 9 is a plan view illustrating a first pixel of a display device according to another example embodiment of the present disclosure. FIG. 10 is a cross-sectional view of the first pixel of a display device, taken along the line II-II' of FIG. 9 according to one or more example embodiments of the present disclosure. FIG. 11 is a cross-sectional view of a first pixel of a display device, taken along the line II-II' of FIG. 9 according to another example embodiment of the present disclosure. The display devices of FIGS. 9-11 are different from those of FIGS. 3, 4, and 7 in the configuration of the electrode pattern. The same configuration as the above-described configuration will be briefly described or omitted.

Referring to FIGS. 9-11, the first pixel SP1 may include the first electrode AE, the second electrode CE, the light emitting elements ED, the first contact electrode CTE1, the second contact electrode CTE2, and an electrode pattern RM.

The electrode pattern RM may be disposed in the same layer as the first electrode AE and the second electrode CE. The electrode pattern RM may be made of the same material as the first electrode AE and the second electrode CE, but is not limited thereto. The electrode pattern RM may be disposed between the first electrode AE and the second electrode CE, and may overlap the light emitting elements ED in the thickness direction. The electrode pattern RM may be spaced from the first electrode AE and the second electrode CE, and may be insulated from the first electrode AE and the second electrode CE by the third passivation layer PAS3.

For example, the electrode pattern RM may be a reflective electrode containing at least one of aluminum (Al), magnesium (Mg), gold (Au), silver (Ag), rhodium (Rh), copper (Cu), titanium (Ti), chromium (Cr), nickel (Ni) or palladium (Pd). The electrode pattern RM may reflect light emitted from the light emitting elements ED toward the first electrode AE or the second electrode CE. Each of the first electrode AE and the second electrode CE may reflect the light received from the electrode pattern RM toward the front side of the display device. The electrode pattern RM may also directly reflect the light emitted from the light emitting elements ED toward the front side of the display device.

The electrode pattern RM may include a first electrode pattern RM1 and a second electrode pattern RM2.

The first electrode pattern RM1 may be disposed to be parallel and adjacent to the first electrode AE, and the second electrode pattern RM2 may be disposed to be parallel and adjacent to the second electrode CE. The first and second electrode patterns RM1 and RM2 may be disposed between the first electrode AE and the second electrode CE, and may be spaced from each other. When the first electrode AE and the second electrode CE extend in the second direction (Y-axis direction) and are spaced from each other in the first direction (X-axis direction), the first electrode pattern RM1 may be disposed adjacent to the first electrode AE to be extended in the second direction (Y-axis direction), and the second electrode pattern RM2 may be disposed adjacent to the second electrode CE to be extended in the second direction (Y-axis direction).

For example, the first and second electrode patterns RM1 and RM2 may be electrically floated. For another example, the first electrode pattern RM1 may be grounded to a specific voltage through a third contact hole CNT3, and the second electrode pattern RM2 may be grounded to a specific voltage through a fourth contact hole CNT4.

The display device includes the electrode pattern RM which is disposed between the first electrode AE and the second electrode CE in the same layer as the first electrode AE and the second electrode CE, so that the loss of the light emitted downward from the light emitting elements ED can be decreased. Consequently, because the display device includes the electrode pattern RM that overlaps the light emitting elements ED in the thickness direction and contains the reflective material, it is possible to enhance the light emission efficiency of the light emitting elements ED, thereby improving the luminance of the display device. The display devices of FIGS. 9-11 include the electrode pattern RM formed as two electrode patterns RM1 and RM2, thereby exhibiting physical or electrical properties different from those of the display devices of FIGS. 3, 4, and 7.

Figure 12:
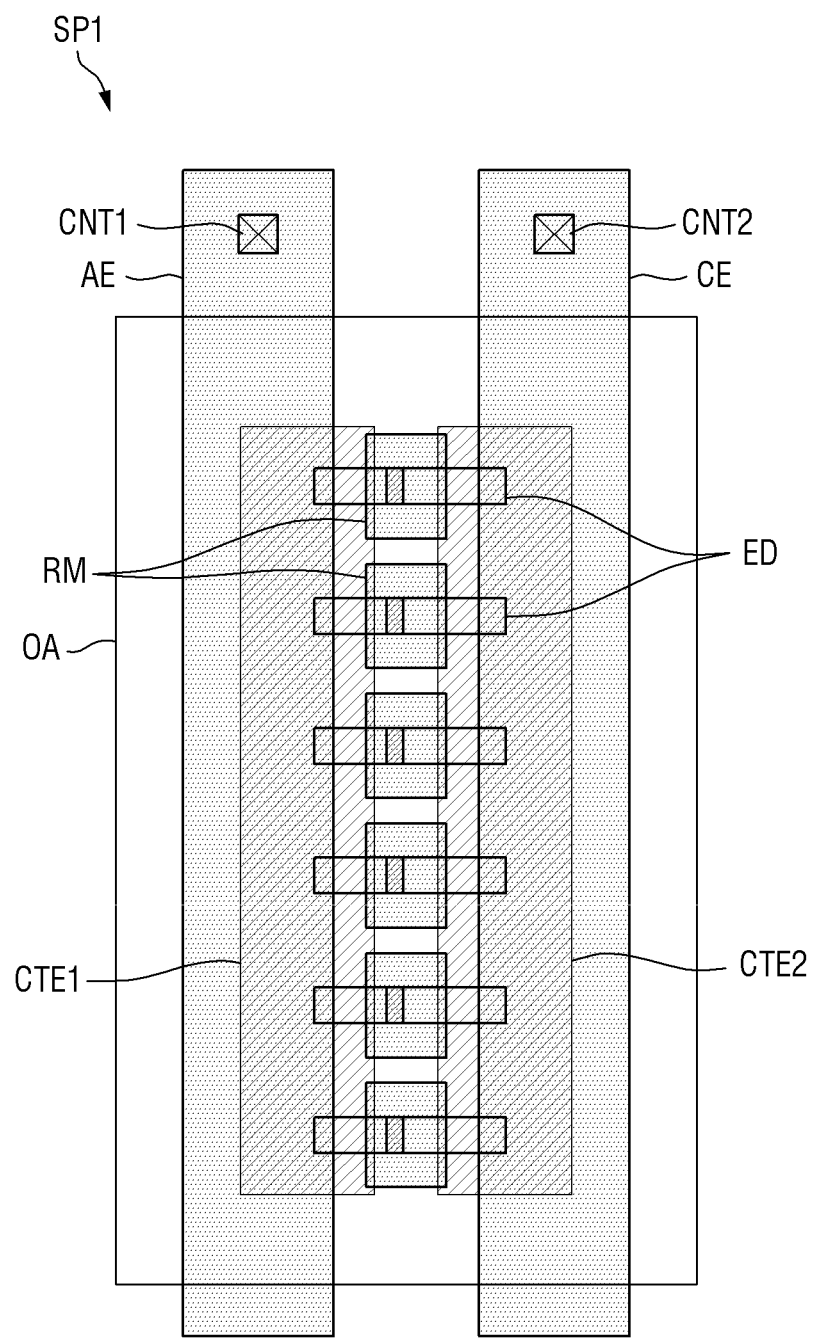
FIG. 12 is a plan view illustrating a first pixel of a display device according to still another example embodiment of the present disclosure.

FIG. 12 is a plan view illustrating a first pixel of a display device according to still another embodiment. The display device of FIG. 12 is different from the display devices of FIGS. 3 and 9 in the configuration of the electrode pattern. The same configuration as the above-described configuration will be briefly described or omitted.

Referring to FIG. 12, the first pixel SP1 may include the first electrode AE, the second electrode CE, the light emitting elements ED, the first contact electrode CTE1, the second contact electrode CTE2, and a plurality of electrode patterns RM.

The plurality of the electrode patterns RM may be disposed in the same layer as the first electrode AE and the second electrode CE. The electrode patterns RM may be made of the same material as the first electrode AE and the second electrode CE, but are not limited thereto. The electrode patterns RM may be disposed between the first electrode AE and the second electrode CE. At least some of the electrode patterns RM may overlap the light emitting elements ED in the thickness direction. The electrode patterns RM may be spaced from the first electrode AE and the second electrode CE, and may be insulated from the first electrode AE and the second electrode CE by a protective film or an insulating film (e.g., see the third passivation layer PAS3 of FIG. 11).

The electrode patterns RM may be arranged to be spaced from each other in the second direction (Y-axis direction). The electrode patterns RM may be arranged in the extension direction of the first electrode AE or the second electrode CE. At least some of the electrode patterns RM may overlap the light emitting elements ED in the thickness direction. The number, size, and shape of the electrode patterns RM may be variably designed to control the amount of light reflection of the electrode patterns RM.

For example, the electrode patterns RM may be electrically floated. For another example, the electrode patterns RM may be grounded to a specific voltage.

Figure 13:
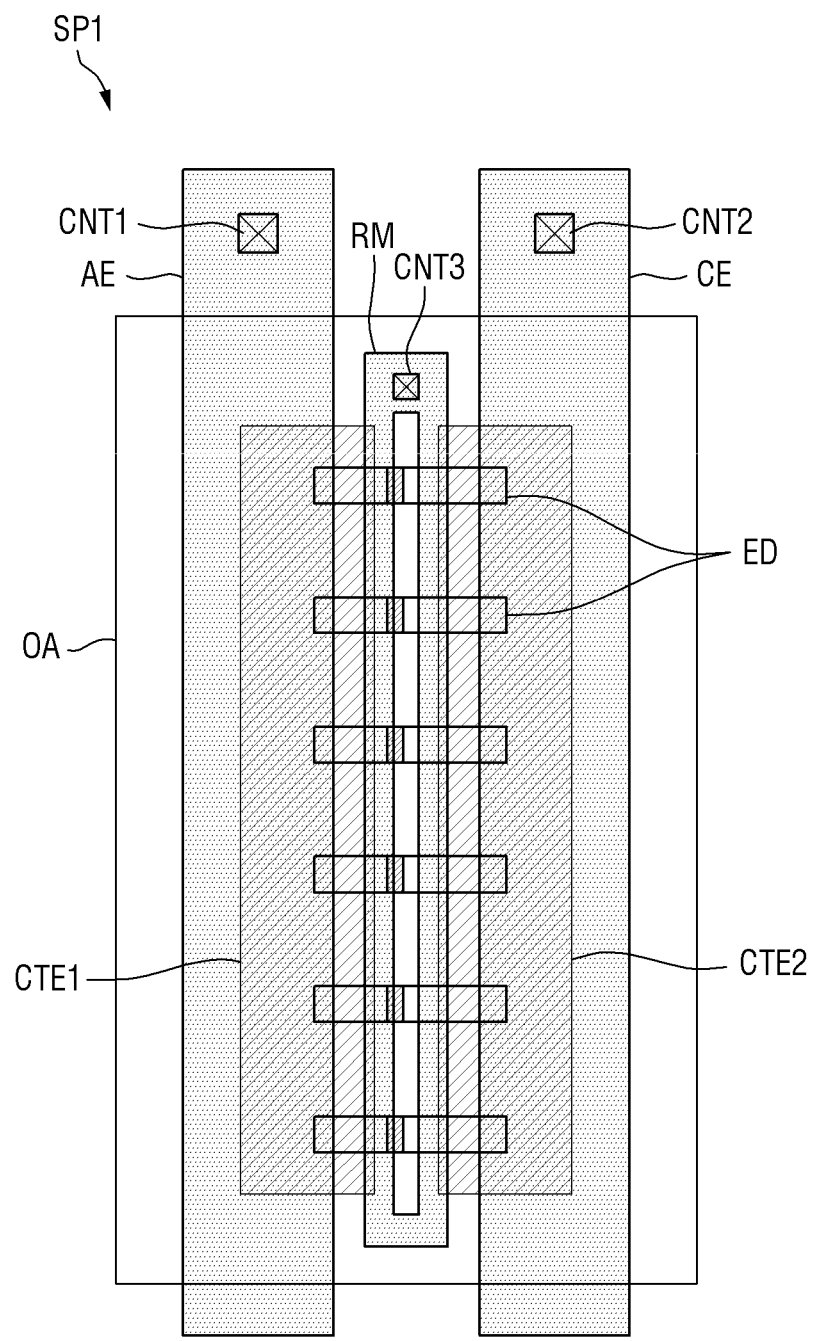
FIG. 13 is a plan view illustrating a first pixel of a display device according to still another example embodiment of the present disclosure.

FIG. 13 is a plan view illustrating a first pixel of a display device according to still another example embodiment of the present disclosure. The display device illustrated in FIG. 13 is different from the display devices illustrated in FIGS. 3, 9 and 12 in the configuration of the electrode patterns. The same configuration as the above-described configuration will be briefly described or omitted.

Referring to FIG. 13, the first pixel SP1 may include the first electrode AE, the second electrode CE, the light emitting elements ED, the first contact electrode CTE1, the second contact electrode CTE2, and an electrode pattern RM.

The electrode pattern RM may be disposed in the same layer as the first electrode AE and the second electrode CE. The electrode pattern RM may be made of the same material as the first electrode AE and the second electrode CE, but is not limited thereto. The electrode pattern RM may be disposed between the first electrode AE and the second electrode CE, and may overlap the light emitting elements ED in the thickness direction. The electrode pattern RM may be spaced from the first electrode AE and the second electrode CE, and may be insulated from the first electrode AE and the second electrode CE by the third passivation layer PAS3.

The electrode pattern RM may be disposed between the first electrode AE and the second electrode CE and may have a closed loop shape. The electrode pattern RM may separately surround a central portion between the first electrode AE and the second electrode CE at a separation. For example, the electrode pattern RM may be electrically floated. For another example, the electrode pattern RM may be grounded to a specific voltage through the third contact hole CNT3.

Figure 14:
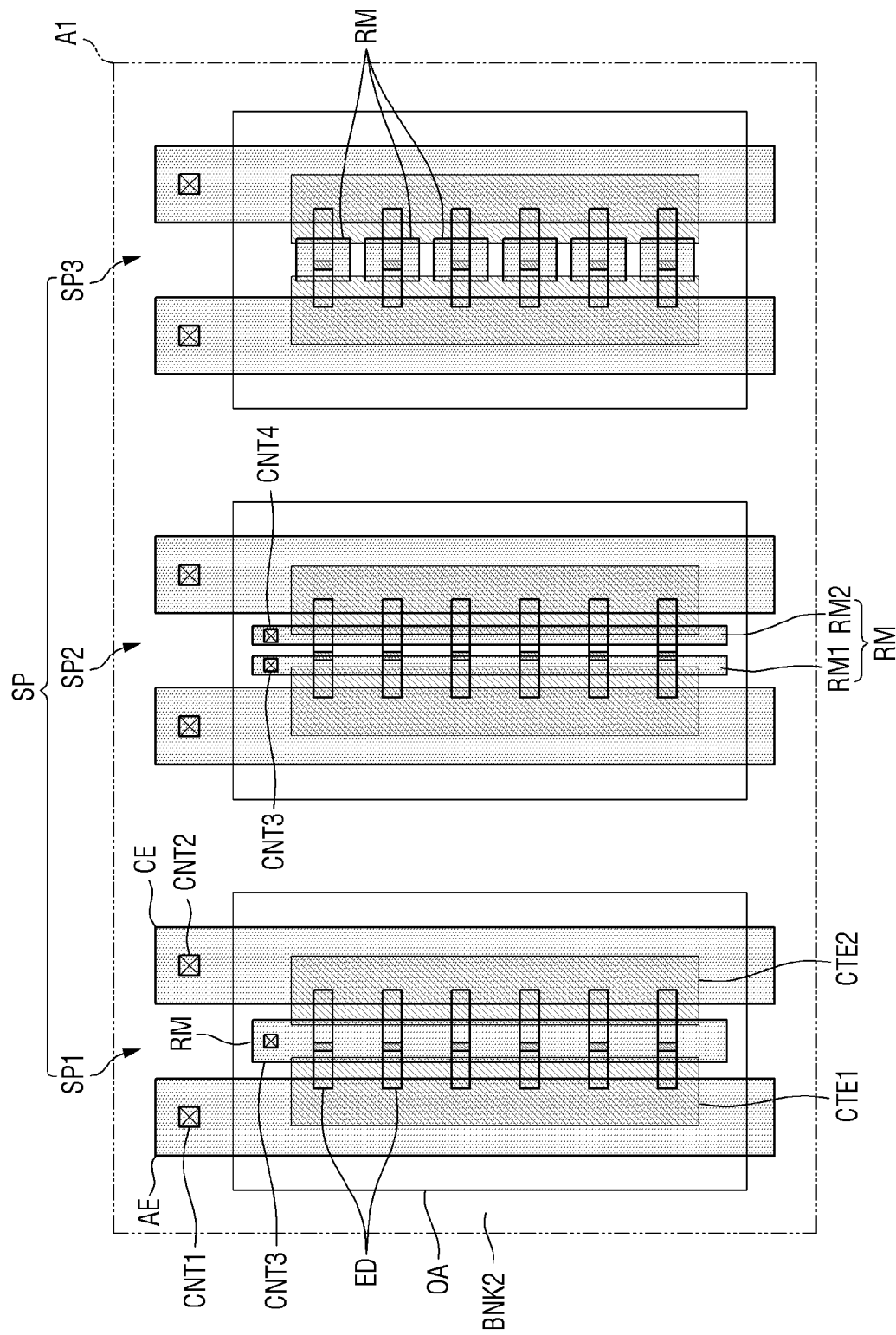
FIG. 14 is an enlarged view of the area A1 of FIG. 1 according to one or more example embodiments of the present disclosure.

FIG. 14 is an enlarged view of the area A1 of FIG. 1 according to one or more example embodiments of the present disclosure.

Referring to FIG. 14, the pixels SP may include first to third pixels SP1, SP2, and SP3. Each of the first to third pixels SP1, SP2, and SP3 may include the light emitting elements ED. The light emitting elements ED may emit light toward the front side of the display device through the opening area OA.

Each of the first to third pixels SP1, SP2, and SP3 may include the first electrode AE, the second electrode CE, the light emitting elements ED, the first contact electrode CTE1, the second contact electrode CTE2, an electrode pattern RM, and the second bank BNK2.

The first to third pixels SP1, SP2, and SP3 may include different electrode patterns RM.

The electrode pattern RM of the first pixel SP1 may be disposed between the first electrode AE and the second electrode CE, and may overlap the light emitting elements ED in the thickness direction. When the first electrode AE and the second electrode CE extend in the second direction (Y-axis direction) and are spaced from each other in the first direction (X-axis direction), the electrode pattern RM of the first pixel SP1 may extend in the second direction (Y-axis direction) between the first electrode AE and the second electrode CE and may be spaced from the first electrode AE and the second electrode CE.

The electrode pattern RM of the second pixel SP2 may include the first electrode pattern RM1 and the second electrode pattern RM2. The first electrode pattern RM1 of the second pixel SP2 may be disposed to be parallel and adjacent to the first electrode AE, and the second electrode pattern RM2 of the second pixel SP2 may be disposed to be parallel and adjacent to the second electrode CE. The first and second electrode patterns RM1 and RM2 may be disposed between the first electrode AE and the second electrode CE, and may be spaced from each other and from the first electrode AE and the second electrode CE. When the first electrode AE and the second electrode CE extend in the second direction (Y-axis direction) and are spaced from each other in the first direction (X-axis direction), the first electrode pattern RM1 may be disposed adjacent to the first electrode AE to be extended in the second direction (Y-axis direction), and the second electrode pattern RM2 may be disposed adjacent to the second electrode CE to be extended in the second direction (Y-axis direction).

The third pixel SP3 may include a plurality of electrode patterns RM. The electrode patterns RM of the third pixel SP3 may be arranged to be spaced from each other in the second direction (Y-axis direction). The electrode patterns RM of the third pixel SP3 may be arranged in the extension direction of the first electrode AE or the second electrode CE. At least some of the electrode patterns RM of the third pixel SP3 may overlap the light emitting elements ED in the thickness direction.

The first to third pixels SP1, SP2, and SP3 include the different electrode patterns RM, so that the difference in the light emitting elements ED of the first to third pixels SP1, SP2, and SP3, the difference in the configurations of the first to third pixels SP1, SP2, and SP3, or the difference in the light emission efficiencies of the first to third pixels SP1, SP2, and SP3 can be compensated.

What is claimed is:

1. A display device comprising:
   a thin film transistor layer comprising at least one transistor on a substrate;
   a first electrode on the thin film transistor layer and connected to the at least one transistor;
   a second electrode spaced from the first electrode on the thin film transistor layer in a first direction that is parallel to the substrate;
   a plurality of light emitting elements connected to the first electrode and the second electrode; and
   an electrode pattern at a same layer as the first electrode and the second electrode and overlapping the plurality of light emitting elements in a thickness direction,
   wherein the electrode pattern is disposed under the light emitting elements, and insulated from the light emitting elements, the first electrode, and the second electrode,
   wherein, in a plan view, a length of the first electrode, a length of the second electrode, and a length of the electrode pattern extend in parallel to each other in a second direction crossing the first direction, the second direction being parallel to the substrate, and
   wherein, in the plan view, the electrode pattern in its entirety is spaced from at least one of the first electrode or the second electrode in the first direction.

2. The display device of claim 1, further comprising:
   a plurality of banks on the thin film transistor layer and having inclined surfaces facing the plurality of light emitting elements,
   wherein each of the first electrode and the second electrode is on the inclined surfaces of the plurality of banks, and the electrode pattern is located between the inclined surfaces of the plurality of banks.

3. The display device of claim 1, further comprising:
   a first passivation layer covering the electrode pattern, at least a portion of the first electrode, and at least a portion of the second electrode,
   wherein the plurality of light emitting elements are located on the first passivation layer to be insulated from the electrode pattern.

4. The display device of claim 3, further comprising:
   a first contact electrode connected to the first electrode through a first contact hole provided in the first passivation layer; and a second contact electrode connected to the second electrode through a second contact hole provided in the first passivation layer,
wherein each of the plurality of light emitting elements comprises first and second semiconductor portions doped with different materials, and
wherein the first contact electrode is connected to the first semiconductor portion, and the second contact electrode is connected to the second semiconductor portion.

5. The display device of claim 4, further comprising:
a second passivation layer covering a central portion of each of the light emitting elements and fixing the plurality of light emitting elements on the first passivation layer;
a third passivation layer covering a portion of the first passivation layer, the first contact electrode, and the second passivation layer; and
a fourth passivation layer covering another portion of the first passivation layer, the second contact electrode, and the third passivation layer.

6. The display device of claim 4, further comprising:
a second passivation layer covering a central portion of each of the light emitting elements and fixing the plurality of light emitting elements on the first passivation layer; and
a third passivation layer covering the first passivation layer, the first and second contact electrodes, and the second passivation layer.

7. The display device of claim 1, wherein each of the first electrode, the second electrode, and the electrode pattern corresponds to a reflective electrode containing at least one of aluminum (Al), magnesium (Mg), gold (Au), silver (Ag), rhodium (Rh), copper (Cu), titanium (Ti), chromium (Cr), nickel (Ni), or palladium (Pd).

8. The display device of claim 1, wherein the electrode pattern is electrically floated, or grounded to a specific voltage.

9. The display device of claim 1,
wherein the electrode pattern extends in the second direction between the first electrode and the second electrode.

10. The display device of claim 1, wherein the electrode pattern comprises:
a first electrode pattern that is parallel and adjacent to the first electrode; and
a second electrode pattern that is parallel and adjacent to the second electrode.

11. The display device of claim 1, wherein the electrode pattern comprises a plurality of electrode patterns, and
the plurality of electrode patterns are be spaced from each other along an extension direction of the first electrode or the second electrode.

12. The display device of claim 1, wherein the electrode pattern is located between the first electrode and the second electrode and has a closed loop shape.

13. The display device of claim 1, further comprising:
a plurality of pixels located on the substrate, each of the pixels comprising at least one first electrode, at least one second electrode, at least one electrode pattern, and light emitting elements corresponding to the at least one first electrode and the at least one second electrode from among the plurality of light emitting elements,
wherein electrode patterns of the plurality of pixels have a same shape.

14. The display device of claim 1, further comprising:
a plurality of pixels, each of the pixels comprising the plurality of light emitting elements corresponding to the first and second electrodes, and the electrode pattern located between the first and second electrodes,
wherein electrode patterns of the plurality of pixels have different shapes.

15. The display device of claim 1, wherein the electrode pattern is electrically floated, or grounded to a specific voltage, and
wherein the thin film transistor layer further comprises a planarization layer on the at least one transistor, and
wherein the first electrode, the second electrode, and the electrode pattern are in contact with one surface of the planarization layer.

16. A display device comprising:
a thin film transistor layer comprising at least one transistor on a substrate;
a plurality of banks patterned on the thin film transistor layer and comprising inclined surfaces;
a first electrode on a portion of the plurality of banks and connected to the at least one transistor;
a second electrode on another portion of the plurality of banks and spaced from the first electrode in a first direction that is parallel to the substrate;
an electrode pattern at a same layer as the first electrode and the second electrode between the inclined surfaces of the plurality of banks;
a first insulating film covering the first electrode, the second electrode, and the electrode pattern; and
a plurality of light emitting elements located on the first insulating film and overlapping the electrode pattern in a thickness direction of the substrate,
wherein the electrode pattern is in between a light emitting element from among the plurality of light emitting elements and the substrate in the thickness direction of the substrate,
wherein the electrode pattern is disposed under the light emitting elements, and insulated from the light emitting elements, the first electrode, and the second electrode,
wherein, in a plan view, a length of the first electrode, a length of the second electrode, and a length of the electrode pattern extend in parallel to each other in a second direction crossing the first direction, the second direction being parallel to the substrate, and
wherein, in the plan view, the electrode pattern in its entirety is spaced from at least one of the first electrode or the second electrode in the first direction.

17. The display device of claim 16, wherein the electrode pattern extends in the second direction between the first electrode and the second electrode.

18. The display device of claim 16, wherein the electrode pattern comprises:
a first electrode pattern that is parallel and adjacent to the first electrode; and
a second electrode pattern that is parallel and adjacent to the second electrode.

19. The display device of claim 16, wherein the electrode pattern comprises a plurality of electrode patterns, and
the plurality of electrode patterns are be spaced from each other along an extension direction of the first electrode or the second electrode.

20. The display device of claim 16, wherein the electrode pattern is located between the first electrode and the second electrode and has a closed loop shape.

* * * * *